United States Patent [19]
Sakui et al.

[11] Patent Number: 6,049,494
[45] Date of Patent: Apr. 11, 2000

[54] SEMICONDUCTOR MEMORY DEVICE

[75] Inventors: Koji Sakui, Tokyo; Yasuo Itoh, Kawasaki; Yoshihisa Iwata, Yokohama, all of Japan

[73] Assignee: Kabushiki Kaisha Toshiba, Kawasaki, Japan

[21] Appl. No.: 09/018,315

[22] Filed: Feb. 3, 1998

[30] Foreign Application Priority Data

Feb. 3, 1997 [JP] Japan .................................. 9-020467

[51] Int. Cl.$^7$ ...................................................... G11C 7/00
[52] U.S. Cl. ..................................... 365/203; 365/185.25
[58] Field of Search .............................. 365/203, 189.05, 365/226, 189.09, 185.25, 185.17

[56] References Cited

PUBLICATIONS

Kang–Dong Suh et al, "A 3.3V 32 Mb NAND Flash Memory with Incremental Step Pulse Programming Schame," IEEE Journal of Solid–State Circuits, vol. 30, No. 11, Nov. 1995.; pp. 1149–1156.

Yoshihisa Iwata et al, "A 35ns Cycle Time 3.3V Only 32 Mb NAND Flash EEPROM," IEEE Journal of Solid–State Circuits, vol. 30 No. 11, Nov. 1995.; pp. 1157–1164.

R. Shirota et al, "A 2.3 pm$^2$ Memory Cell Structure for 16 Mb NAND EEPROMS", IEDM '90 Technical Digest, Dec. 1990; pp. 103–106.

Tae–Sung Jung et al. "A 3.3V 128 Mb Multi–Level NAND Flash Memory for Mass Storage Applications," 1996 IEEE International Solid–State Circuits Conference, Digest of Technical Papers, pp. 32–33.

Tomoharu Tanaka et al. "A Quick Intelligent Program Architecture for 3V–only NAND–EEPROMs" 1992 Symposium on VLSI Circuits Digest of Technical Papers, pp. 20–21.

Tomoharo Tanaka et al., "A Quick Intelligent Page–Programming Architecture and a Shielded Bitline Sensing Method for 3 V–Only NAND Flash Memory," IEEE Journal of Solid–State Circuits, vol.29, No. 11. Nov. 1994, pp. 1366–1373.

*Primary Examiner*—A. Zarabian
*Attorney, Agent, or Firm*—Banner & Witcoff, Ltd.

[57] ABSTRACT

A semiconductor memory device includes a memory cell array in which memory cell units are arranged in a matrix, each memory cell unit being constructed by connecting plural memory cells, each of which is electrically rewritable, a select gate connected to a select gate line for connecting a memory cell unit to a bitline, a precharge circuit connected to a first node of the bitline, for supplying a precharge voltage higher than an power supply voltage in programming of data, and a latch circuit connected to a second node of the bitline via a transfer gate for holding data to be programmed into a memory cell, wherein channels of the plurality of the memory cells constituting a selected memory cell unit are charged to the precharge voltage in programming of data.

26 Claims, 15 Drawing Sheets

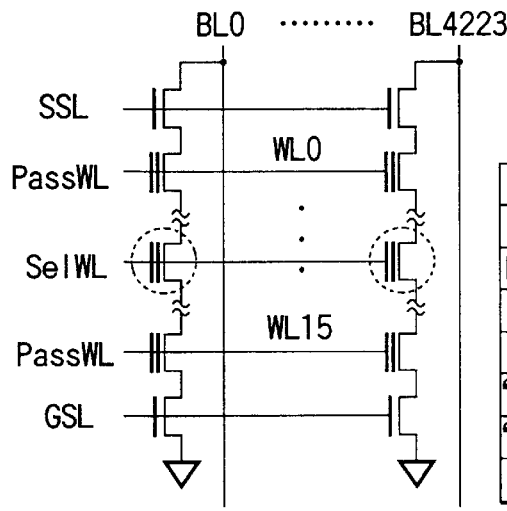
FIG. 3A PRIOR ART
FIG. 3B PRIOR ART
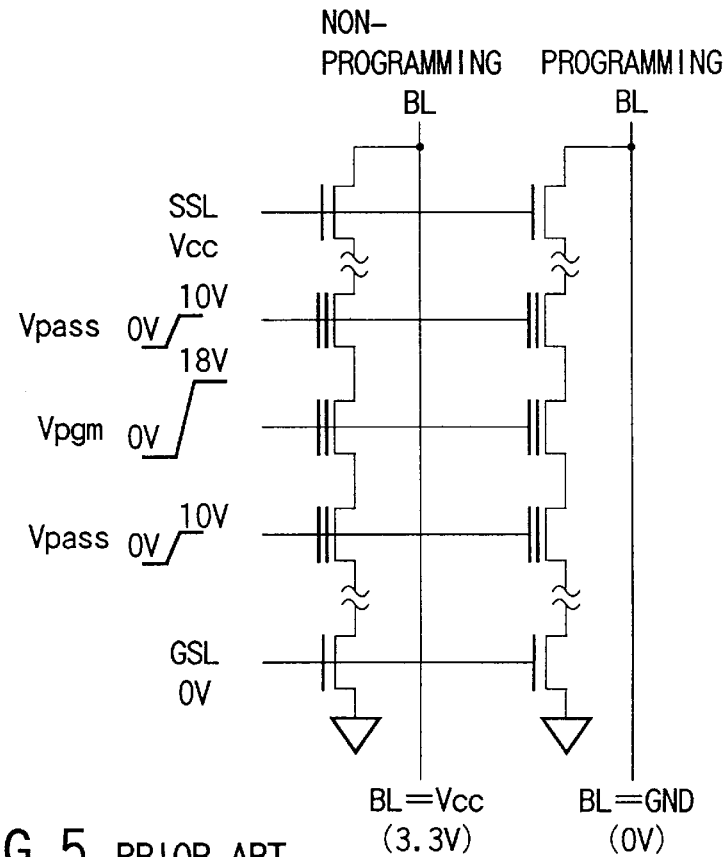
FIG. 5 PRIOR ART

|  | PROGRAMMING | READ | VERIFY READ |
|---|---|---|---|
| BL | 0V ("1" DATA)<br>8V ("0" DATA) | 1.8V<br>1.5V (DUMMY) | 1.8V<br>1.5V (DUMMY) |
| SG1 | 10V | 3V | 3V |
| CG1 | 10V | 3V | 3V |
| CG2 | 10V | 3V | 3V |
| CG3 | 10V | 3V | 3V |
| CG4 | 10V | 3V | 3V |
| CG5 | 10V | 3V | 3V |
| CG6 | 18V | 0V | 0.6V |
| CG7 | 10V | 3V | 3V |
| CG8 | 10V | 3V | 3V |
| SG2 | 0V | 3V | 3V |

16,049,494

SEMICONDUCTOR MEMORY DEVICE

BACKGROUND OF THE INVENTION

The present invention relates to a semiconductor memory device and more particularly, a semiconductor memory device comprising memory cell units, such as a NAND cell, an AND cell, a DINOR cell and the like, wherein a plurality of memory cells are connected to one another.

As a kind of semiconductor memory cells, EEPROMs which are electrically rewritable are known. Among them, an NAND cell type EEPROM, in which plural memory cells are connected to each other in series to construct a NAND cell block, has drawn attention since it can be highly integrated.

One memory cell of a NAND cell type EEPROM (hereinafter referred to as NAND cell) has a FETMOS structure in which a floating gate (charge storage layer) and a control gate are stacked in a layered manner on a semiconductor substrate with an insulating film interposing therebetween. Plural memory cells in the structure are serially connected to each other in such a manner that a source or a drain is shared between memory cells adjacent to each other, whereby a NAND cell is constructed. Such NAND cells are configured in a matrix to form a memory cell array.

Drains at one side of NAND cells are connected to a bitline through a select gate transistor in such a manner that drains on the one side of the NAND cell adjacent to a bitline are commonly connected to the bitline, whereas sources on the other side are connected to a common source line each through a select gate transistor. Control gates of memory cell transistors (hereinafter referred to as cell transistor) disposed along a row direction of a memory cell array are commonly connected to one another to constitute a word line. On the other hand gate electrodes of select gate transistors disposed along a row direction are commonly connected to one another to constitute a select gate line.

Well known examples of a non-volatile semiconductor memory device using such a conventional NAND cell are disclosed in K. D. Suh et al., "A 3.3 V 32 Mb NAND Flash Memory with Incremental Step Pulse Programming Scheme", IEEE. J. Solid-State Circuits, vol. 30, pp. 1149 to 1156, Nov. 1995 (Reference 1) and Y. Iwata et al., "A 35 ns Cycle Time 3.3 V Only 32 Mb NAND Flash EEPROM", IEEE J. Solid-State Circuits, vol. 30, pp. 1157 to 1164, Nov. 1995 (Reference 2) and the like.

Operations in a non-volatile semiconductor memory device using a conventional NAND cell are described in the reference 1. The content will be described in reference to FIGS. 1 to 3B.

FIG. 1 is a block diagram showing a construction of a memory cell array and FIG. 2 is a detailed block diagram of a page buffer P/B in FIG. 1. FIG. 3A and FIG. 3B are a diagram and a table showing operations of erase, read and programming in biased conditions. In FIGS. 1 to 3B, BSEL indicates a block select signal, BL0 to BL4223 indicate bitlines, CSL indicates a source line, CG0 to CG15 indicate common gate lines, SSL and GSL respectively indicate select gate lines on the bitline and source line sides and WL0 to WL15 respectively indicate word lines. In FIG. 3A and FIG. 3B, PassWL and SelWL respectively indicate a non-selected (pass) word line and a selected word line. The block select signal BSEL is output from a block decoder, which selects a memory cell block. In the page buffer P/B, a latch circuit as a sense amplifier connected to each bitline is provided, as shown in FIG. 2.

In an erase operation, the common gate lines CG0 to CG15 in FIG. 1 are grounded. A block select signal BSEL is at a high level (a power supply voltage) a block select signal of a non-selected block is maintained at a low level (the ground potential). Therefore, a word line in the non-selected block is at the ground potential and a word line in the non-selected block is in a floating state.

Then, an erase pulse of 21 V and 3 ms is applied to a bulk (a p-well in which a memory cell is formed). As a result, in the selected block, an erase voltage (21 V) is applied between the p-well and a word line, electrons in a floating gate flow into the p-well by an FN (Fowler-Nordheim) tunnel current and a threshold voltage of the memory cell becomes almost −3 V. Since an excessive erase is not problematic in a NAND type flash, a memory cell is erased deeply to the order of −3 V with one erase pulse.

On the other hand, a non-selected block is not affected by an erase pulse because of a presence of capacitive coupling between a word line in a floating state and a p-well. The source of a transistor for which a block select signal BASEL is supplied, a metal interconnect between the source and a word line made of polysilicon and the control gate made of polysilicon are connected to the word line in a floating state. A coupling ratio is calculated from a capacitance connecting the word line in a floating state. As the capacitance, there are related to: a source junction capacitance of a transistor for whose gate a block select signal is supplied; an overlap capacitance between the source and the gate; a capacitance between polysilicon and metal interconnection on the field; a capacitance between a control gate made of silicon and a p-well; and the like. Among them, the capacitance between a control gate made of silicon and the p-well is conspicuously large so as to occupy a greater part of the total magnitude. For this reason, a coupling ratio obtained from actually measured results was as large as about 0.9 and a FN tunnel current can be prevented from flowing. Erase verify to confirm an end of erase can be decided by whether or not a threshold voltage of each of all the memory cells in a selected block is reduced to be equal to or less than −1 V.

In a read operation, cell data of one page are simultaneously transferred to a latch circuit in a page buffer and successively read out. FIG. 4 is a waveform diagram showing operational signals in a read operation. The cell data of one page are sensed, the page buffer is at "0" in the first stage, that is at a low level and initialized to a condition where the data in the memory cell are read. At this point, a bit line is at 0 V, a select gate lines SSL, GSL are at 4.5 V (time of t1 of FIG. 4). Thereafter, a selected word line in the selected block (NAND cell) and a non-selected word line in the selected block are respectively supplied with pass voltages of 0 V and 4.5 V (time of t2 of FIG. 4). The voltage 4.5 V supplied for the non-selected word line is higher than a threshold voltage of each cell after programming and erase and thereby all the non-selected cells each works as a pass-transistor.

On the other hand, only a cell transistor which has been erased is conductive because of a selected word line applied with 0 V. Therefore, a NAND cell in which a cell after erase is read out works as a pass to bias a bitline to the ground potential and a NAND cell in which a cell after programming is read out works so as to place the bit line in an open condition. At a time t3 shown in FIG. 4, a direct sense route from the bitline to a latch circuit is intercepted by making a signal PGM shown in FIG. 2 low in level. For this reason, latch data is determined only through a transistor for sense. A load in a PMOS current-miller circuit CM which supplies a load current at 2 $\mu$A to a bitline at a reference voltage Vref is activated. A bitline which reads a cell after erase keeps a low level, since a load current flows, and a bitline which reads a cell after programming becomes a high level. The bitline which reads a cell after programming makes the transistor Tr for sense conductive and therefore, the latch circuit is reversed to "1" (t4).

In such a manner, a latch circuit having read data from a written cell stores data "1" and a latch circuit having read data from an erased cell stores data "0." These latch data pass through a read circuit and then transformed into a normal logic level. Therefore, after all the latch circuits of one page are simultaneously set, continuous read can be made possible.

In a programming operation, programming data are continuously loaded on a page buffer. The data "0" is cell data for programming and the data "1" is cell data to prohibit programming. The cycle of programming is repeated till all the latched data "0" are programmed in all the cells. Each programming cycle comprises a programming operation and a verify operation in which excessive programming is prevented in a cell in which "0" is programmed. In a more detailed manner, a programming cycle of 40 $\mu$s comprises the following steps of:

(1) Bitline set up (8 $\mu$s): A level of a bitline is set at 0 V according to programming data in a page buffer (latch circuit) and when programming is prohibited, the level is set at Vcc.

(2) Programming (20 $\mu$s): A programming voltage is input as a short pulse in a selected word line.

(3) Discharge of a word line (4 $\mu$s): A high voltage of a selected word line is discharged and the selected word line is prepared for input for of a successive low verify potential.

(4) Programming verify (8 $\mu$s): Whether or not a threshold voltage of a programming cell is programmed to an extent equal to or more than a target value.

In a verify operation, a latch circuit in which programming has sufficiently been effected, changes the data "0" to the data "1" and prevents from being programmed. A bias condition in a verify operation is almost the same as that in a read operation, but data in a programming condition is held in the latch circuit and a voltage 0.7 V other than 0 V is supplied for a selected word line. In this condition, when a threshold voltage of a programming cell is in excess of 0.7 V, that is when programming is sufficiently effected, data in the latch circuit is changed from the data "0" to the data "1." Since the latch circuit which has latched the data "1" only performs a change from the data "0" to the data "1" in a verify operation, no influence receives in the verify operation. A cycle of programming is repeated till all the latch circuits in the page buffer come to hold the data "1" or till it reaches the maximum programming time period of 10 cycles.

FIG. 5 shows bias conditions for a programming prohibiting potential which is supplied to the channel of a selected cell. A transistor of a select gate line SSL on the bitline side is a conductive condition, a transistor of a select gate line GSL on the source line side is in a non-conductive condition, a bitline of a cell to be programmed is set at 0 V, and a bitline of a cell prohibited from programming is set at $V_{cc}$. Each channel of the NAND cell is biased to the ground potential by the bitline supplied with a voltage 0 V. When a programming voltage is applied to the gate of a select cell, a large potential difference arises between the floating gate and the channel, so that electrons are injected by a FN tunnel current into the floating gate. In the cell prohibited from programming, since a power supply voltage $V_{cc}$ is applied to a bitline, a channel of a select NAND cell is precharged.

When a word line of the selected NAND cell, that is, a selected word line to be input with a programming voltage, and a non-selected word line to be input with a pass voltage are activated, a capacitance of the channel is automatically increased in voltage by series coupling of capacitances among a word line, a floating gate, a channel and p-well. In such a manner, a channel voltage of a NAND cell prohibited from programming in a selected block is determined by capacitive coupling between the word line and the channel.

Therefore, in order to sufficiently increase a programming prohibiting potential, it is important to effect sufficient initial charge of the channel or to increase a coupling ratio between the word line and the channel.

A coupling ratio B between a word line and a channel is calculated in the following way:

$$B=Cox/(Cox+Cj),$$

wherein Cox is a total of gate capacitances between the word line and the channel and Cj is a total of junction capacitances of a source and a drain in a cell transistor. A channel capacitance of a NAND cell is a sum of the total of gate capacitances and the total of the junction capacitances. An overlap capacitance between a select gate and a source, a capacitance between a bitline and a source or a drain and the like are very small, compared with the whole of the channel capacitances and therefore neglected here.

In the case of a 64 Mb NAND cell with a 0.4 $\mu$m rule, W (a gate width)/L (a gate length)=0.4 $\mu$m/0.38 $\mu$m in a transistor and a pitch of word line is 0.76 $\mu$m. In this NAND cell type EEPROM, a gate capacitance $C_{ox}$ and junction capacitance Cj are almost equal to each other and a coupling ratio is 0.5. The junction capacitance changes more or less according to processing conditions, such as impurity concentrations of a p-well, a source and drain of a cell transistor and the like. On page 1153 of the reference 1, there is disclosed that a coupling ratio is 80%, and in order to realize this ratio, for example, a junction capacitance Cj is required to be one-fourth of a conventional value. However, in order to decrease the junction capacitance, it is required to make an impurity concentration of a p-well smaller or to make impurity concentrations of source and drain smaller. The former has a limitation, since it requires a decrease in field withstand voltage between memory cells. The latter decesses a cell current because it makes a resistance between the source and drain increased.

A method in which a gate capacitance Cox is increased but a junction capacitance is decreased is described in Shirota et al., "A 2.3 $\mu$m$^2$ Memory Cell Structure for 16 Mb NAND EEPROMs", in IEDM '90 technical Digest, pp. 103 to 106, Dec. 1990 (Reference 3). In the reference 3, a method in which a width of a word line (a channel length of a cell transistor) is broadened and a space between adjacent word lines is smaller with no change in a pitch of word line. This method has a problem in fabrication.

There is another method in which a p-well in which a cell is formed is biased negative in programming and thereby a depletion layer for a junction capacitance is extended, so that the junction capacitance is decreased. However, since the junction capacitance is approximately proportional to a reciprocal of a square root of a sum between a built-in voltage and a reverse bias of the junction, even if 2 V is applied to a p-well with a channel voltage of 6 V, the junction capacitance is only decreased to about 90% of the case where this method is not applied and a large effect cannot be expected. Moreover, to actually perform this method, there are more circuits and more power to give a negative bias to the p-well.

As mentioned above, while there are various methods to increase a coupling ratio, each method has a problem.

Besides, in the reference 2 and T. Tanaka et al., "A Quick Intelligent Program Architecture for 3 V Only NAND-EEPROM's", in Symp. VLSI Circuits Dig. Tech. Papers, June 1992, pp. 20 to 21 (Reference 4), a method in which a channel voltage of a NAND cell prohibited from programming in a programming operation is supplied in a way different from the reference 1. In the reference 1, a channel voltage is increased by a capacitive coupling between a channel in a floating state and a word line. On the other hand, in the references 2 and 4, a programming prohibiting potential which is boosted by a charge pump in a peripheral circuit of a chip is directly supplied to the channel through a bitline.

FIG. 6 is a circuit showing a sense amplifier comprising a memory cell and a bitline, and FIG. 7 shows bias conditions for erase, read and programming operations of a NAND cell. In a programming operation of selected NAND cell, by a sense amplifier, Vpp (18 V) is applied to a selected word line CG6 (control gate line), Vm (10 V) is applied to non-selected word lines CG1 to CG5 and CG7 to CG8 and a select gate SG1, 0 V is applied to a bitline in which programming is performed and Vmb (8 V) is applied to a bitline in which programming is not performed. Therefore, a channel of a NAND cell prohibited from programming is supplied through a bitline and a select gate line with a fixed voltage of 8 V. At this point, while the voltage Vm of a select gate line and a non-selected word line is 2 V higher than that of a bit line in which programming is not performed, the reason why is that a threshold voltage of the select gate, which is 2 V, and a threshold voltage of a programmed cell, when it is located closer to the bitline side of a NAND cell than a cell to be programmed, are considered.

There are named the following two problems in the references 2 and 4. A first problem is that a programming prohibiting potential is supplied to a bitline from a sense amplifier. For this reason, a transistor constituting the sense amplifier is required to be a high voltage transistor. In the case where a power supply voltage $V_{cc}$ is 3.3 V, a transistor into which the power supply voltage $V_{cc}$ is input has a gate oxide film, for example, as thin as 120 Å. Therefore, a gate length is short, that is a design rule, for example as severe as 0.4 μm can be adopted for a design.

On the other hand, a transistor which can endure a programming prohibiting potential of 8 V has, for example, an oxide film thickness as thick as 200 Å and a gate length as long as 1 μm. That is, this transistor is required to design using a rule as mild as, for example 1 μm. Thus an area for layout for a sense amplifier is increased and it becomes hard to layout a sense amplifier in a corresponding manner to a fine bitline.

A second problem is that a high voltage, in which threshold voltages of a non-selected word line and a select gate line are considered, is required to be applied to the non-selected word line and the select gate line, which works a pass transistor, in order to input a programming prohibiting potential through a bitline to a channel. To increase a voltage of the non-selected word line brings about a problem that errors arise in programming a non-selected cell of a NAND cell to be programmed. Therefore, a problem further arises that a programming prohibiting potential is limited to a voltage at which no errors arise in programming, so that an allowable range (window) of a programming prohibiting potential is narrower. Moreover, when a select gate line is increased, the gate oxide film receives a larger electric field, since the channel of the NAND cell which performs programming has a voltage Vcc, which causes a break down of an oxide film of the select gate.

BRIEF SUMMARY OF THE INVENTION

It is an object of the present invention to provide a semiconductor device: in which a programming prohibiting potential, after a channel of a NAND cell in a floating state is boosted in voltage, is made higher by capacitive coupling with a word line; besides in which a margin for errors in programming is broadened; and thus whose reliability can be improved.

It is another object of the present invention to provide a semiconductor memory device, in which a severe design rule in designing a sense amplifier can be adopted by supplying a voltage to a channel of a NAND cell from a source other than a sense amplifier and thereby a layout area can be decreased, and thus which is not expensive.

A semiconductor memory device according to a first aspect of the present invention comprises a memory cell array in which memory cell units are arranged in a matrix, each memory cell unit being constructed by connecting plural memory cells, each of which is electrically rewritable; a select gate connected to a select gate line for connecting a memory cell unit to a bitline; a precharge circuit connected to a first node of the bitline, for supplying a precharge voltage higher than an power supply voltage in programming of data; and a latch circuit connected to a second node of the bitline via a transfer gate for holding data to be programmed into a memory cell, wherein channels of the plurality of the memory cells constituting a selected memory cell unit are charged to the precharge voltage in programming of data.

A semiconductor memory device according to a first aspect of the present invention comprises a memory cell array in which memory cell units arranged in a matrix, each memory cell unit being constructed by connecting plural memory cells, each of which is electrically rewritable; a select gate connected to a select gate line for connecting a memory cell unit to a bitline; a row selecting circuit for selecting a word line of the memory cell array and the select gate line; a voltage generating circuit connected to the row selecting circuit and for generating a programming voltage; a column selecting circuit for selecting the bitline of the memory cell array; a precharge circuit connected to a first node of the bitline for supplying a precharge voltage higher than an power supply voltage in programming of data; and a latch circuit connected to a second node of the bitline via a transfer gate for holding data to be programmed into a memory cell; a control circuit for controlling the voltage generating circuit, the precharge circuit and the transfer gate, wherein the control circuit executes in programming data into the memory cell: a first operation in which a signal is supplied to the precharge circuit, and a voltage of a channel of a memory cell in a selected memory cell unit is charged to the precharged voltage via the bitline; a second operation in which a voltage of the channel of a memory cell is biased to a programming prohibiting voltage higher than the precharge voltage by supplying the programming voltage to a word line through which programming is performed in a selected memory cell from the voltage generating circuit and by capacitive coupling between the word line and the channel of the memory cell connected thereto; and a third operation, in which the transfer gate is made conductive, and in which potentials of a bitline and the channel voltage of the memory cell unit are controlled based on programming data held in the latch circuit.

Preferred manners according to the first aspect of the present invention are as follows:

(1) The precharge voltage is generated by a booster circuit provided in the semiconductor memory device.

(2) The precharge voltage is supplied from an outside of the semiconductor memory device.

(3) The precharge circuit comprises: an n-channel MOS transistor in which the source is connected to the bitline and the drain is connected to the precharge voltage supply mode.

(4) The voltage generating circuit supplies a voltage higher than the precharge voltage to the gate of the MOS transistor constituting the precharge circuit, all the word lines of the selected memory cell unit and the select gate line in a programming.

(5) The control circuit electrically disconnects the precharge circuit from the bitline in the second operation.

(6) The control circuit reduces potential of a word line in which the programming voltage is supplied to the adjacent word line to a voltage equal to or lower than the power supply voltage in the second operation.

(7) The control circuit reduces potentials of a word line in which the programming voltage is supplied to the adjacent word line and the select gate line connected to the select gate to a voltage equal to or lower than the power supply voltage in the second operation.

(8) The control circuit electrically disconnects the precharge circuit from the bitline in the third operation.

(9) A load transistor connected between the second node of the bitline and a electric source for suppressing reduction in potential of the bitline is further provided, and the control circuit executes an operation in which the load transistor is made conductive and reduction in potential of the bitline through which programming is prohibited is suppressed in control of potentials of the bitline and the channel of the memory cell based on programming data held in the latch circuit in the third operation.

(10) The control circuit executes the third operation after executing the second operation.

(11) The control circuit executes the second operation after executing the third operation.

In the first aspect of the present invention, a precharge voltage before a channel of a memory cell unit is in a floating state is set high. Therefore, a programming prohibiting potential after the channel and a word line is subjected to capacitive coupling can be high. Thus, a margin for errors in programming can be broadened and a reliability can be increased.

A semiconductor memory device according to the second aspect comprises a memory cell array in which memory cell units are arranged in a matrix, each memory cell unit being constructed by connecting plural memory cells, each of which is electrically rewritable; a select gate connected to a select gate line for connecting a memory cell unit to a bitline; a row selecting circuit for selecting a word line of the memory cell array and the select gate line; a voltage generating circuit connected to the row selecting circuit for generating a first voltage higher than a power supply voltage by at least a threshold voltage of the select gate and a programming voltage; a column selecting circuit for selecting the bitline of the memory cell array, wherein in programming data into a memory cell, a power supply voltage is supplied to a non-programming bitline, the first voltage is supplied to the select gate line from the voltage generating circuit, channels of the memory cells in the memory cell unit, to which the non-programming bitline is connected, are charged to a precharge voltage higher than a differential voltage between potential of the non-programming bitline and a threshold voltage of the select gate and brought into a floating state, thereafter the programming voltage produced by the voltage generating circuit is supplied to the word line in a selected memory cell unit, the channels of the memory cells in the floating state is biased to a programming prohibiting potential higher than the precharge voltage by capacitive coupling with the word line.

Preferred manners are as follows:

(1) The potential supplied to the non-programming bitline is a power supply voltage in a chip or that supplied from an outside of the chip.

(2) The voltage generating circuit generates the first voltage higher than a power supply voltage by the threshold voltage of the select gate or the memory cell, and the first voltage is supplied to the select gate line or the word line from the voltage generating circuit in programming of data to the memory cell.

(3) In programming of data to the memory cell, after the channels of the memory cells are charged to the precharge voltage higher than the differential voltage between potential of the non-programming bitline and the threshold voltage of the select gate, a voltage supplied to the select gate line is reduced to make the select gate is cut off.

(4) In programming of data to the memory cell, after the channels of the memory cells are charged to the precharge voltage higher than the differential voltage between potential of the non-programming bitline and the threshold voltage of the select gate, a voltage supplied to the select gate line is reduced to a second voltage equal to or lower than the power supply voltage and equal to or higher than a threshold voltage of the select gate from the first voltage and the select gate is cut off.

(5) A timing at which the voltage supplied to the select gate line is reduced to the second voltage from the first voltage; a timing at which the programming voltage is supplied to a selected word line; and a timing at which potential of a non-selected word line of a selected memory cell unit is increased to about half the programming voltage are almost the same.

In the second aspect of the present invention, a precharge voltage higher than an electric source is applied to a bitline with no sense amplifier electrically interposing therebetween. For this reason, the sense amplifier is not required to be constructed with a high voltage transistor. Thus a severe rule can be adopted in designing the sense amplifier, which makes it possible to decrease a layout area.

As mentioned above, according to the present invention, a channel portion of a NAND cell is precharged at a higher voltage than a electric source and a programming prohibiting potential is further increased by capacitive coupling between a selected word line and a select cell in which programming is not performed. Therefore, a margin for errors in programming is broadened to a great extent. A precharge of a bitline before programming is effected by a precharge separated from the sense amplifier. For this reason, the sense amplifier can comprise a transistor which can endure a common power supply voltage, and thus which can be designed with the minimum rule. Accordingly, a layout area for a sense amplifier can be decreased.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principle of the present invention in which:

FIG. 3A is a diagram for illustrating an operation of FIG. 1 and FIG. 3B is a table showing bias conditions for each operation;

FIG. 5 is a diagram for illustrating bias conditions for a programming prohibiting potential to be supplied to the select channel shown in FIG. 1;

DETAILED DESCRIPTION OF THE INVENTION

First Embodiment

Figure 1:
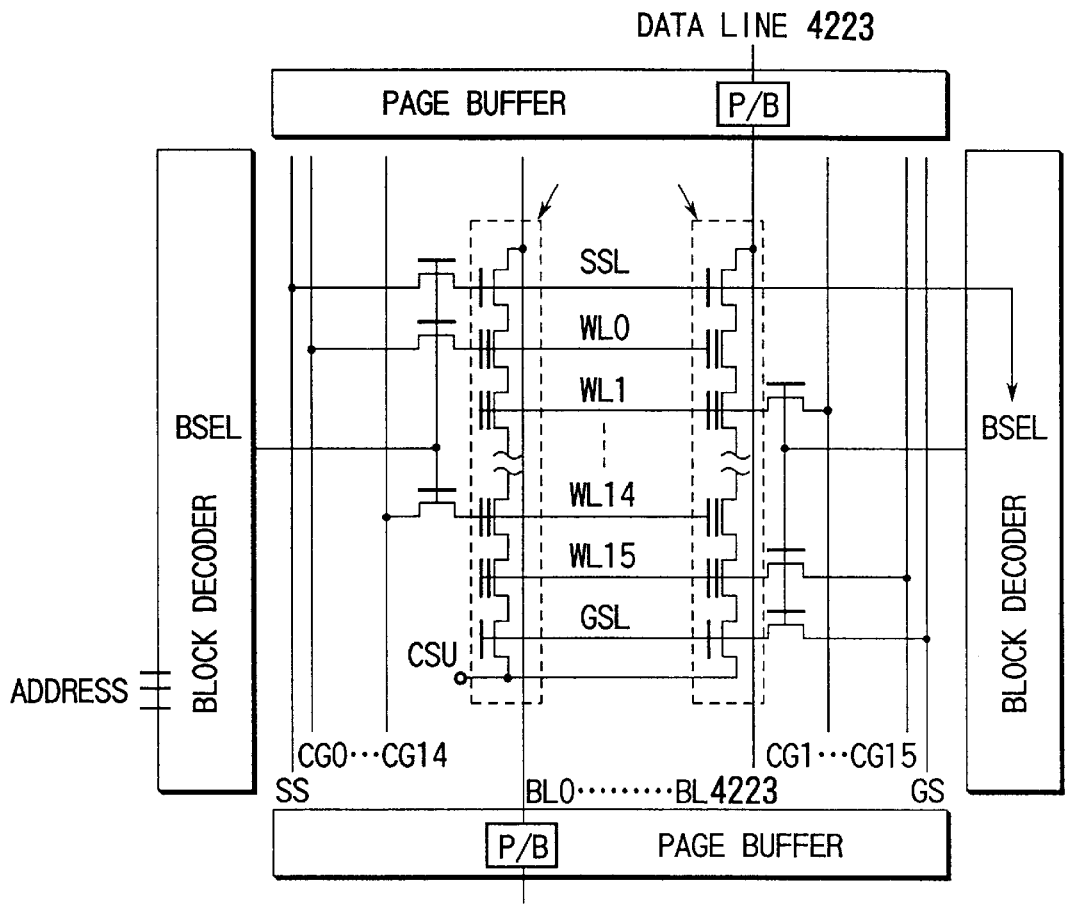
FIG. 1 is a block diagram showing a construction of a conventional memory array.
Figure 2:
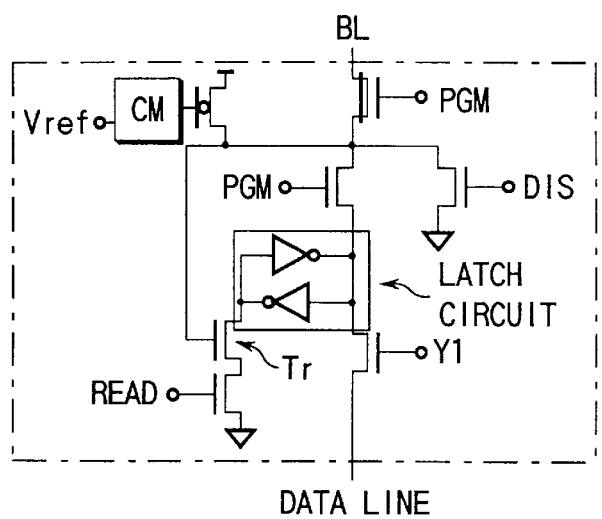
FIG. 2 is a circuit diagram of a page buffer shown in FIG. 1.
Figure 4:
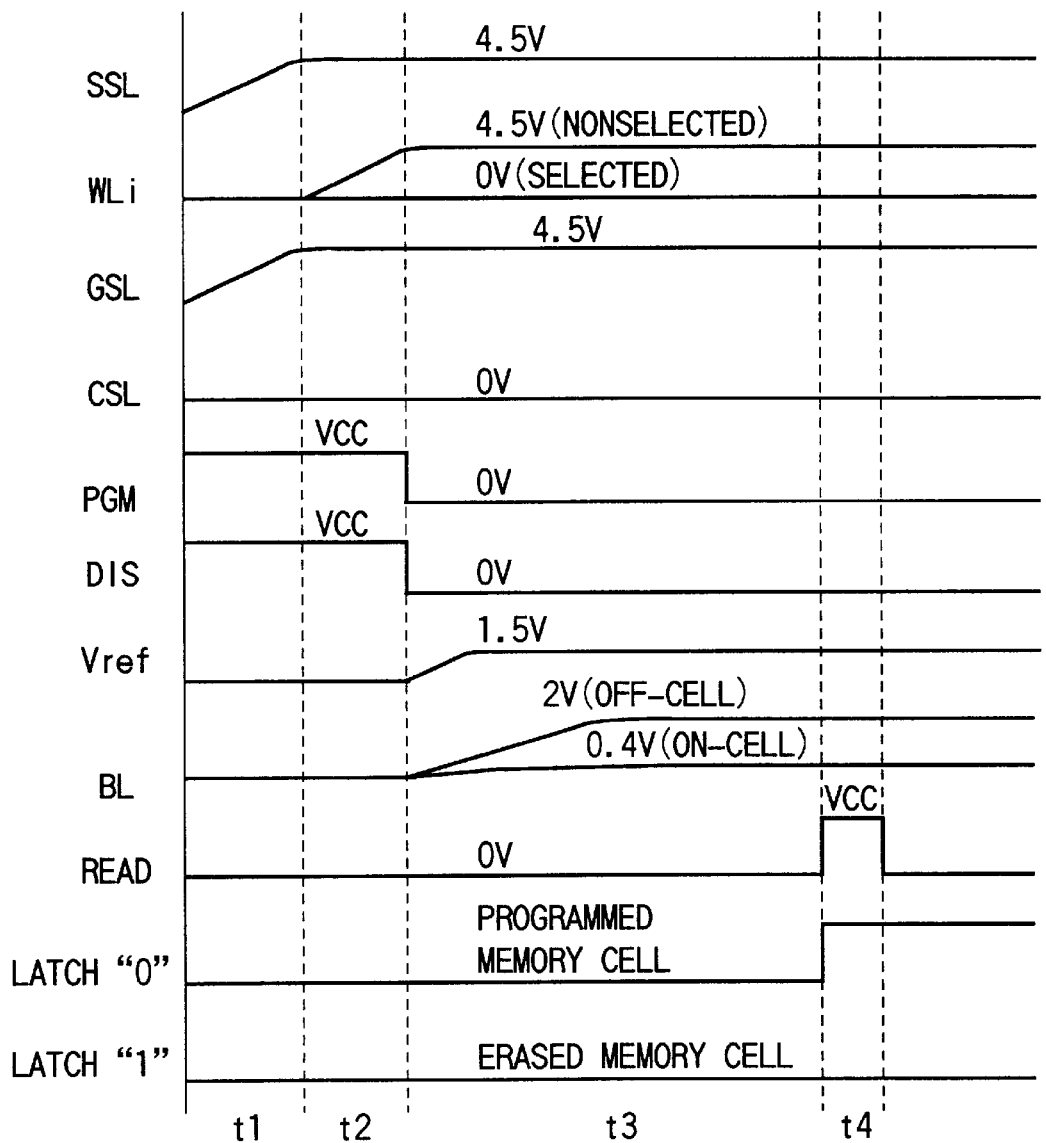
FIG. 4 is a diagram showing waveforms showing operational signals in a read operation.
Figure 6:
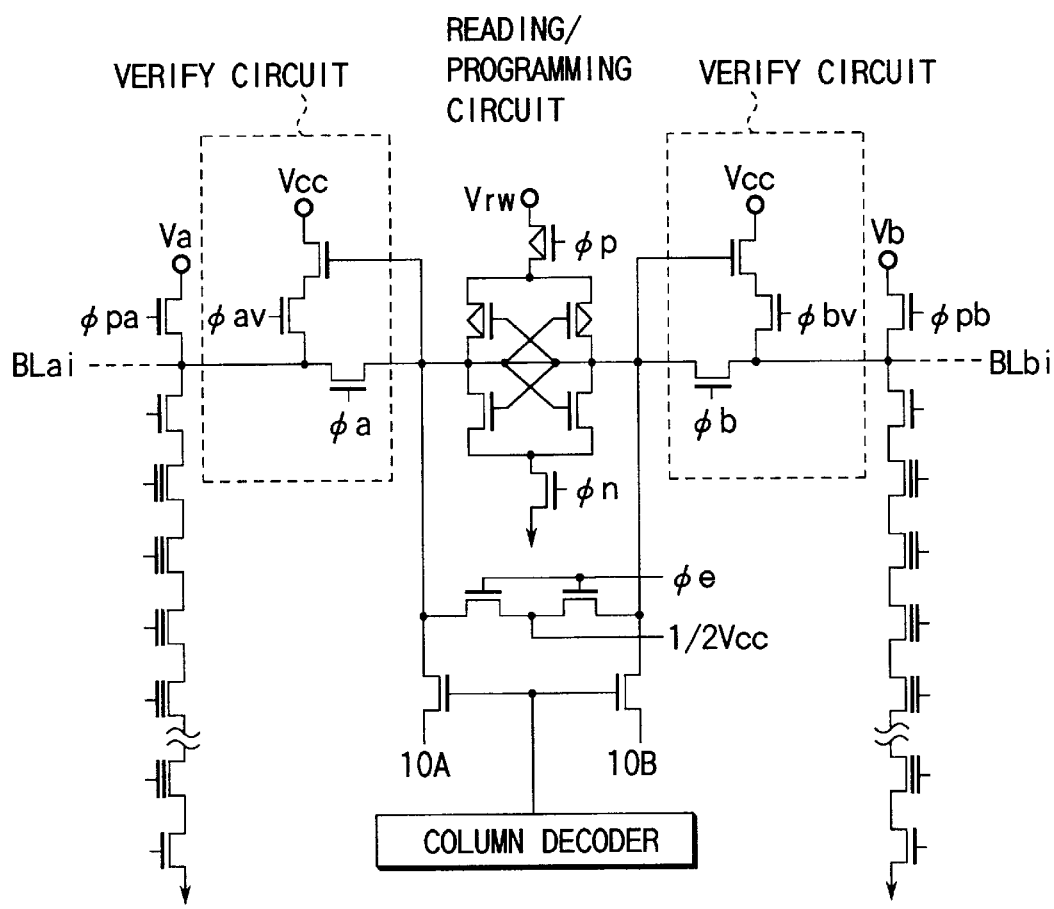
FIG. 6 is a circuit diagram showing a conventional sense amplifier.
Figures 7, 8:
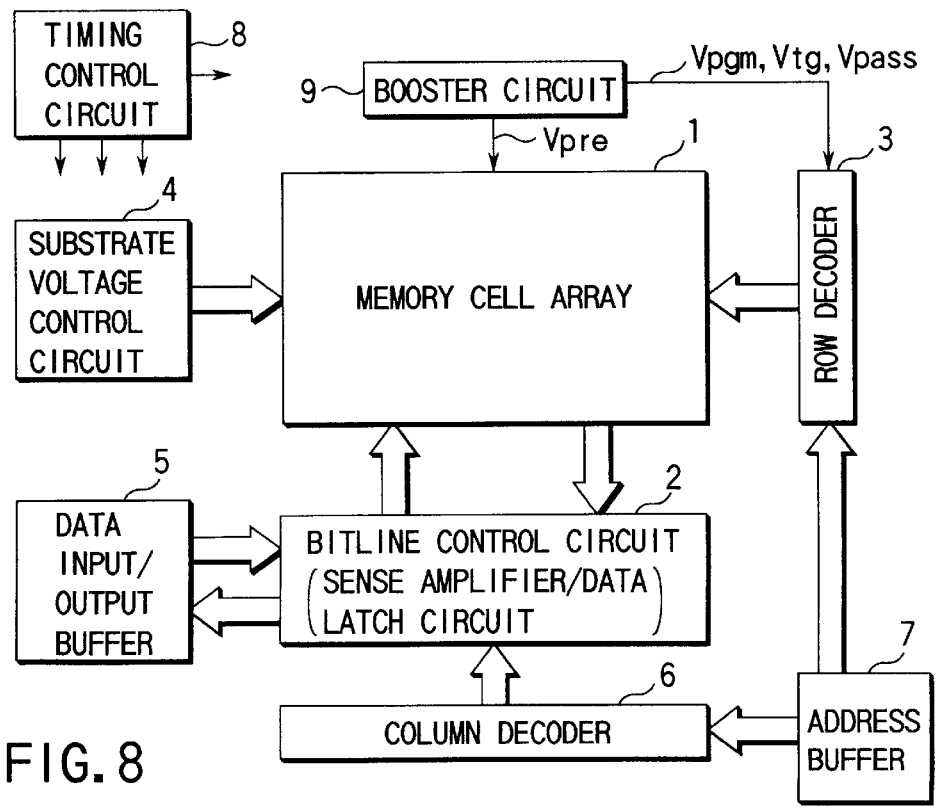
FIG. 7 is a table showing bias conditions for each operation shown in FIG. 6.
FIG. 8 is a block diagram showing a construction of the present invention.

FIG. 8 is a block diagram showing a construction of a semiconductor memory device to which the present invention is applied.

A memory cell array 1 comprises plural NAND cells (not shown) which are arranged in a matrix in column and row directions, word lines, bitlines, select lines and source lines connected to the NAND cells. A bitline control circuit 2, a row decoder 3 as row selecting means, a substrate voltage control circuit 4 are connected to the memory cell array 1. The bitline control circuit 2 is mainly constructed with a CMOS flip-flop circuit. The flip-flop circuit performs latch of data to be programmed in a memory cell, a sense operation to detect a voltage of a bitline, a sense operation for verify read after programming and latch of data to be reprogrammed. The bitline control circuit 2 is connected to by a data input/output buffer 5 and a column decoder 6 as column selecting means.

An address buffer 7 is connected to the row decoder 3 and the column decoder 6. An address signal from the address buffer 7 is supplied to the decoder 3 and the column decoder 6. The row decoder 3 and column decoder 6 select predetermined word lines and bitlines in the memory cell 1 according to the address signal.

A timing control circuit 8 produces a signal for control programming, read and verify operations and the like of the semiconductor memory device. A booster circuit 9 is connected to the row decoder 3 and the memory cell 1. The booster circuit 9 operates as a voltage generating circuit of a programming voltage $V_{pgm}$, $V_{pass}$, A precharge voltage $V_{pre}$, potential $V_{lg}$ and the like from a power supply voltage $V_{cc}$.

The substrate voltage control circuit 4 controls a voltage of a p-type region (p-substrate or p-type well) constituting the memory cell 1.

Figure 9:
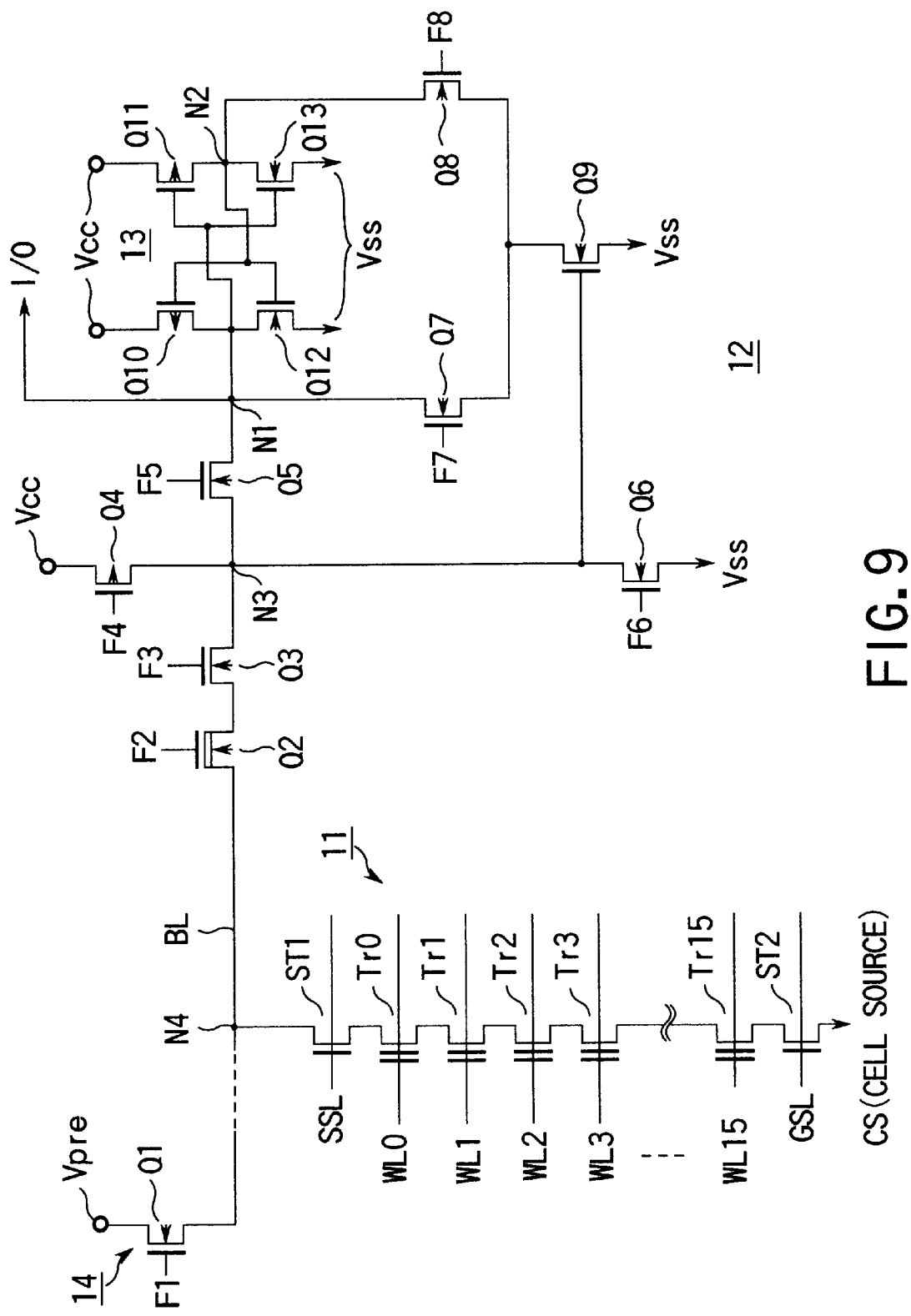
FIG. 9 is a circuit diagram showing a main part of FIG. 8.

FIG. 9 is a circuit diagram relating to the first embodiment of the present invention and shows a main part of FIG. 8. The circuit comprises a NAND cell 11, a bitline BL, a data latch circuit 12 comprising a sense amplifier 13 and a precharge circuit 14.

In FIG. 9, the NAND cell 11 is connected to the bitline BL. The NAND cell comprises select gate transistors ST1, ST2 and cell transistors Tr0 to Tr15 each having a multi-layered gate type FETMOS structure, a source line CSL (Cell Source) of a memory cell. The cell transistors Tr0 to Tr15 are connected to each other in series while mutually sharing a source/drain region. A drain of the cell transistor Tr0 is connected to a bitline through the select gate transistor ST1 and a source of the cell transistor Tr15 is connected a source line CS through the select gate transistor ST2. The control gates of the cell transistors Tr0 to T15 are respectively connected to word lines WL0 to WL15 and the gates of the select transistors ST1, ST2 are respectively connected to select gate lines SSL, GSL.

The source of an n-channel MOS transistor Q1 constituting a precharge circuit 14 is connected to a node N4 of the bitline BL. The transistor Q1 is a high voltage transistor to precharge the bitline BL and the drain is supplied with a precharge voltage $V_{pre}$ output from the booster circuit 9. A control signal F1 is supplied to the gate of the transistor Q1. When the power supply voltage $V_{cc}$ has 3.3 V, the precharge voltage is set at, for example, 6 V.

On the other hand, n-channel MOS transistors Q2, Q3 are in series connected between an end of the bitline BL and a node N3. The transistor Q2 is a high voltage transistor of a depletion mode and the transistor Q3 is a high voltage transistor. The transistors Q2, Q3 are controlled by control signals F2, F3. The drain of a p-channel transistor Q4 is connected to the node N3. The power supply voltage $V_{cc}$ is supplied to the source of the transistor Q4 and a control signal F4 is supplied to the gate thereof. The transistor Q4 operates as a load transistor in a bitline in a read operation.

N-channel MOS transistors Q5 to Q9, Q12, Q13 and p-channel MOS transistors Q10, Q11 constitute a data latch circuit 12. Among them, the transistors Q10, Q11, Q12, Q13 constitute a sense amplifier 13. The drains of the transistor Q10, Q12 are connected to a node N1 and the N1 is connected to a input/output line I/0. The transistor Q5 is connected between the nodes N1, N3. The gate of the transistor Q5 is supplied with a control signal F5. The transistor Q6 is connected between the node N3 and a ground potential $V_{ss}$. A control signal F6 is supplied to the gate of the transistor Q6. The transistors Q7, Q8 are connected between the node N1 and the drains (the node N2) of the transistors Q11, Q13. A control signal F7 is supplied to the gate of the transistor Q7 and a control signal F8 is supplied to the gate of the transistor Q8. The transistor Q9 is connected between a junction of the transistors Q7, Q8 and a ground potential $V_{ss}$. The gate of the transistor Q9 is connected to the node N3.

Operations in the above mentioned construction will be described.

Figure 10:
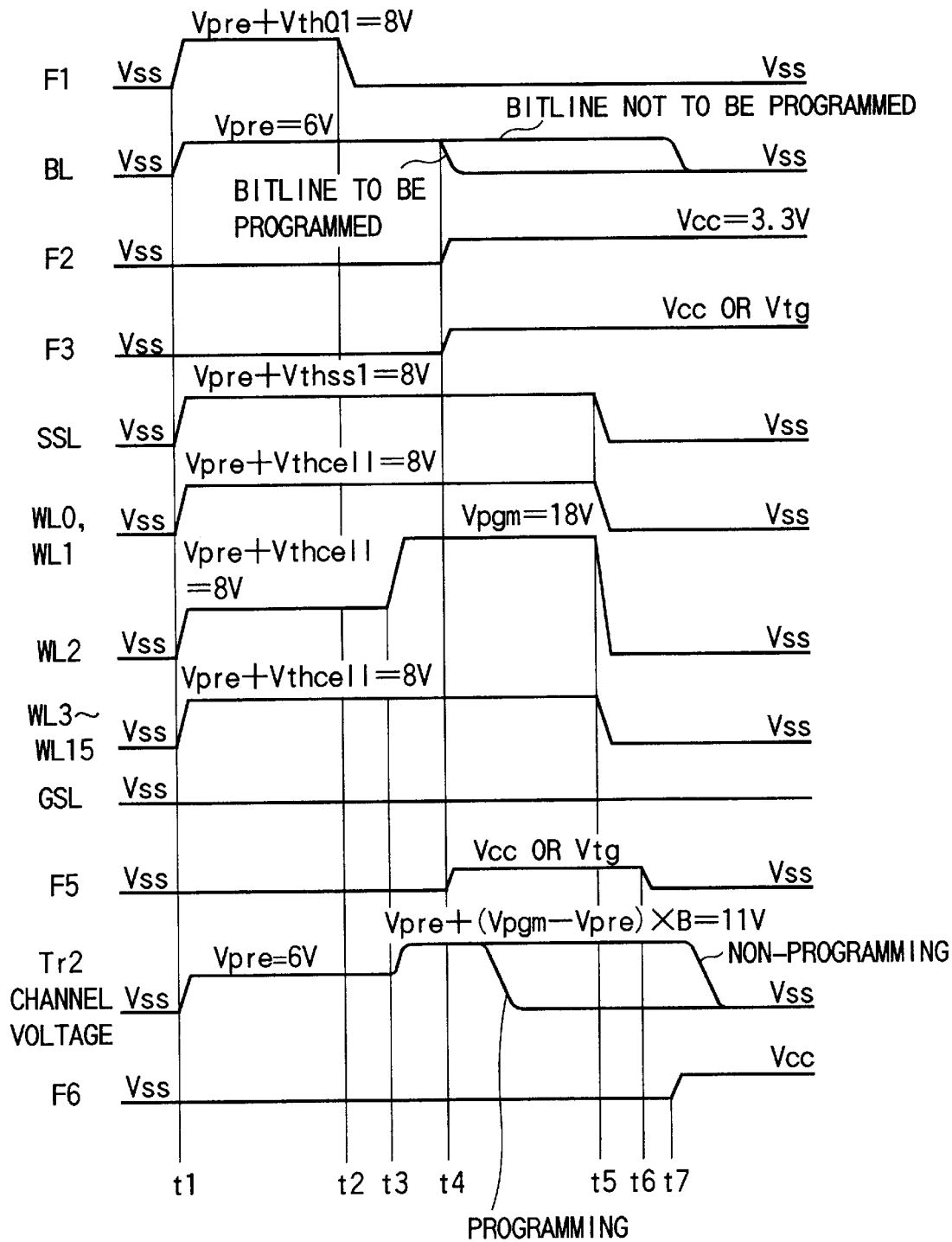
FIG. 10 is a diagram showing waveforms of potentials in programming in a circuit shown in FIG. 9 according to a first embodiment of the present invention.

FIG. 10 is a diagram showing waveforms of potentials in programming in a circuit shown in FIG. 9 according the first embodiment. When the programming operation is started, programming data is loaded to the sense amplifier 13 from the input/output line I/O. As a result, the node N1 of the sense amplifier for a bitline to be programmed is set at $V_{ss}$ (0 V) and the node N1 of the sense amplifier for a bitline not to be programmed is set at $V_{cc}$ (3.3 V).

Then, The bitline precharge signal F1 becomes potential of (a precharge voltage $V_{pre}$)+(a threshold voltage $V_{thQ1}$) summed (time t1). The voltage is, for example, 8 V. At this point, the transistor Q2, Q3, Q5 are in the off state. As a result, the bitline is charged to a precharge voltage $V_{pre}$ (6 V). At the same time, word lines WL0 to WL15 and select gate lines SSL are also increased to $V_{pass}$ (8 V). As a result, the voltages of the channels (sources and drains are included) of all the transistors constituting the select NAND cell assume $V_{pre}$ (6 V). A voltage higher than the precharge voltage $V_{pre}$ by a threshold voltage of a transistor at a select gate and a threshold voltage of a cell transistor after programming is input to the word lines WL0 to WL15 of the select NAND cell and the select gate line SSL. In the case where a precharge voltage $V_{pre}$ is set at a voltage which is sufficiently higher even when considering a drop in threshold voltages of transistors, a gate voltage of each transistor may be a precharge voltage.

After the bitline and the NAND cell are precharged as mentioned above, a bitline precharge signal F1 is decreased to the ground potential $V_{ss}$ (0 V) from the potential $V_{pre}$+$V_{thQ1}$. For this reason, the bitline and the channels of the NAND cell is in the floating state (time t2).

Here, the case where programming is performed, for example, in the word line WL2 will be described. A voltage of the word line WL2 is increased from potential $V_{pre}$+$V_{thcell}$ (8 V) to a programming voltage $V_{pgm}$, for example, 18 V. In company with this increase, potential of the channel of the cell transistor Tr2 is increased by capacitive coupling between the channel and the word line WL2. At this point, when a voltage of the channel of the cell transistor Tr2 is increased, for example, if a capacitive coupling ratio B between the channel of the cell transistor Tr2 and the word line WL2 is 0.5, while the adjacent transistors Tr1, Tr3 are cut off, a voltage of the channel of the cell transistor Tr2 is 6 V+(18 V−8 V)×0.5=11 V. In order to sufficiently perform such cut off, potential of each of the word lines WL1, WL3 is decreased to, for example, $V_{cc}$ (3.3 V) from $V_{pre}$+$V_{thcell}$ (8 V). This will be described in the second embodiment.

Control signals F2, F3, F5 of transfer gates between a bitline and a sense amplifier are in a high level and the transistors Q2, Q3, Q5 are conductive (time t4). At this point, potentials of the control signals F2, F3, F5 are the power supply voltage $V_{cc}$, $V_{cc}$ or $V_{ig}$ and $V_{cc}$ or $V_{ig}$ respectively. The potential Vig is in between the ground potential and the power supply voltage, for example, 1.8 V. When the transistors Q2, Q3, Q5 are conductive, potential of the bitline BL changes based on programming data stored in the sense amplifier 13. That is, in a programming operation, the bitline is discharged and assumes the ground voltage $V_{ss}$ (0 V), since the node N1 is at the ground potential $V_{ss}$ (0 V). As a result, the channel of the NAND cell connected to the bitline BL assumes the ground potential. Therefore, potential difference between the channel of the cell transistor Tr2 and the control gate thereof is 18 V and thereby electrons is injected to the floating gate, so that programming is performed.

On the other hand, when programming is not performed, the bitline BL is kept at the precharge voltage $V_{pre}$ (6 V), since the node N1 of the sense amplifier 13 is at the power supply voltage $V_{cc}$ (3.3 V). Therefore, the channel of the NAND cell connected to the bitline is not discharged and maintains to be in a floating state. Thereby, the channel of the cell transistor Tr2 keeps a high level (11 V) even though the word line is applied with 18 V. For this reason, a voltage between the word line WL2 and the channel of the cell transistor Tr2 and electrons are not injected into the floating gate of the cell transistor Tr2.

Thereafter, when programming to memory cells relating to the word line WL2 is completed, the word lines WL0, WL1, WL3 to WL15 are reset to the ground potential $V_{ss}$ (0 V) from potential $V_{pre}$+$V_{thcell}$ (8 V) and the word line WL2 is reset to the ground potential $V_{ss}$ (0 V) from a programming voltage $V_{pgm}$ (time t5). The select gate line SSL is set to the ground potential $V_{ss}$ (0 V) from potential $V_{pre}$+$V_{thssl}$ (8 V). Thereafter, the control signal F5 is decreased to the ground voltage $V_{ss}$ from the power supply voltage $V_{cc}$ or a voltage $V_{tg}$ and the sense amplifier 13 and the bit line BL are separated from each other by the transistor Q5 (time t6).

Then, the control signal F6 is set to the power supply voltage $V_{cc}$ from the ground potential $V_{ss}$. And a bitline in which programming has not been performed is discharged through the transistor Q6 (time t7). Thereafter, programming verify is performed. The programming verify is not the essence of the present invention and description thereon is omitted.

The programming verify is similar to methods described in U.S. Pat. No. 5,361,227 and the reference 4.

The reason why the transistors Q2, Q3 are high voltage transistors, is as described in the following. In an erase operation, a bitline is, for example, at a voltage as high as 20 V. At that point, the transistors Q2, Q3 each play a roll of a buffer, as well, so that a high voltage is not applied to a circuit in a sense amplifier. Moreover, the transistors Q2, Q3 protect the sense amplifier from a precharge voltage, which is a high voltage supplied to a bitline in a programming operation.

According to the above mentioned embodiment, the transistor Q1 as a precharge circuit 14 is connected to an end of the bitline BL and in a programming operation, the bitline is charged at a precharge voltage $V_{pre}$ higher than the power supply voltage $V_{cc}$ through the transistor Q1. Therefore, since all the channels of the NAND cell can be charged at the precharge voltage, a programming prohibiting potential after capacitive coupling with a word line can be set high and increase a margin in a programming operation.

The precharge voltage $V_{pre}$ is supplied to the bitline BL through a precharge circuit 14 and a sense amplifier is not interposed, which makes it unnecessary to make the sense amplifier endure against a high voltage. Therefore, the minimum design rule available can be applied to transistors constituting the sense amplifier and thereby a layout area can be decreased.

Moreover, the precharge circuit can be so constructed as with one transistor Q1. Therefore, even when a distance between adjacent bitlines is narrowed, the transistor Q1 is laid out with ease.

Second Embodiment

Figure 11:
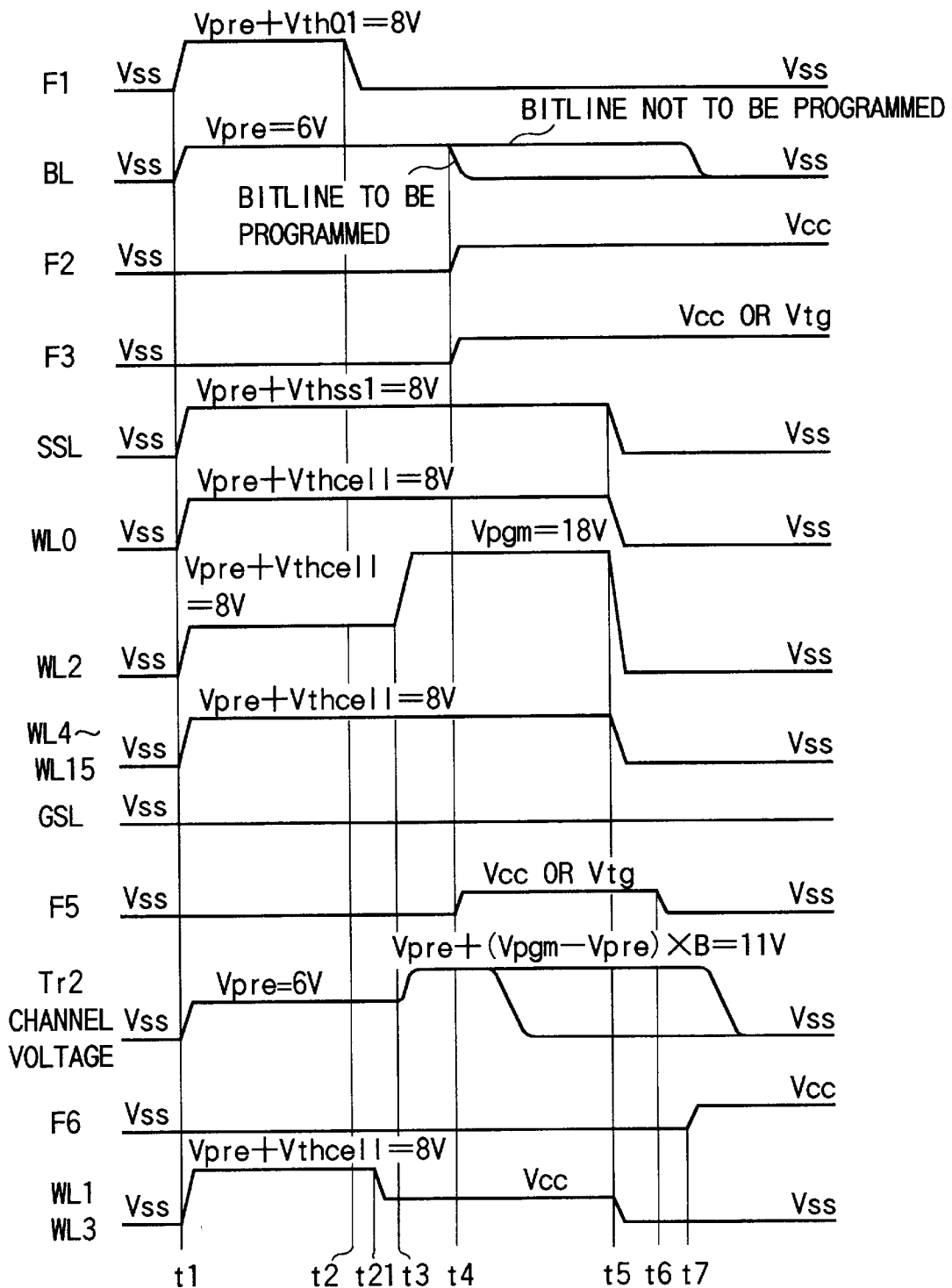
FIG. 11 is a diagram showing waveforms of potentials in programming in a circuit shown in FIG. 9 according to a second embodiment of the present invention.

FIG. 11 is a diagram showing waveforms of potentials in programming in a circuit shown in FIG. 9 according to a second embodiment. In this embodiment, since operations from the start till a bitline is precharged at a precharge voltage $V_{pre}$+a threshold voltage $V_{thQ1}$ (8 V) and a bitline and the channels of all the transistors constituting a NAND cell are brought to be in a floating state (time t1 to t2) are the same as in the first embodiment, descriptions thereon are omitted.

As mentioned above, the situation in which the bitline and a channel of the NAND cell are in the floating state, for example, the case where programming is performed in a word line WL2 will be described. In this case, word lines WL1, WL3 each are decreased from potential $V_{pre}+V_{thcell}$ (8 V) to a power supply voltage $V_{cc}$ (3.3 V) (time 21). As a result, cell transistors Tr1, Tr3 are swiftly cut off and the channel of the cell transistor Tr2 is separated from the NAND cell. A point which is different from the first embodiment is that, when potentials of the word lines WL1, WL3 are set somewhat higher than $V_{pre}+V_{thcell}$ in the first embodiment, the cell transistors Tr1, Tr3 are not cut off immediately even if potential of the word line WL2 is increased to $V_{pgm}$, whereas in the second embodiment, the cell transistors Tr1, Tr3 are cut off at the same time as when increase in potential of the word line.

After potentials of the word lines WL1, WL3 are reduced to the power supply voltage $V_{cc}$ from a voltage of 8 V, potential of the word line WL2 is increased to a programming voltage $V_{pre}$, for example, 18 V (time t3) from potential $V_{pre}+V_{thcell}$ (8 V). A timing to increase potential of the word line WL2 may be the same time as that when the potentials of the WL1, WL3 are reduced to 3.3 V from 8 V (time t21). As potential of the word line WL2 is increased, potential of the channel of the cell transistor Tr2 is increased by capacitive coupling between the channel and the word line WL2. For example, if a capacitive coupling ratio B between the channel of the cell transistor Tr2 and the word line WL2 is 0.5, the channel potential is 6 V+(18 V–8 V)×0.5=11 V. When the channel of the cell transistor Tr2 is increased to 11 V, a charge in the channel of the cell transistor Tr2 does not migrate into the adjacent memory cell transistors Tr1, Tr3, since the cell transistors Tr1, Tr3 are cut off. Therefore, a channel potential of the cell transistor Tr2 can be increased efficiently.

A technique, referred to as Local Self Boost by the author, in which only potential of the channel of a memory cell to which programming is not performed is increased, whereas potentials of a selected word line and a word line adjacent thereto are lowered to the ground potential $V_{ss}$ (0 V) is described in T. S. Jung et al., "A 3.3 V 128 Mb Multi-Level NAND Flash Memory for Mass Storage Applications", in ISSCC Dig. Tech. Papers, February 1996, pp. 32 to 33 (Reference 5). In this reference, however, potentials of the selected word line and the word line adjacent thereto are reduced to the ground potential $V_{ss}$ (0 V). For this reason, random page programming cannot be performed. In a general practice, programming in a NAND cell is sequentially performed from a memory cell on the cell source side, which is remote from a contact of a bitline. On the other hand, random page programming is to program in a memory cell of the NAND cell in a random manner.

That is, in the case of the reference 5, when a selected word line and a word line adjacent thereto are reduced to the ground potential (0 V) and if data is already programmed in a memory cell connected to another adjacent word line which is located on the bitline side of the selected word line, the cell transistor is cut off since the gate thereof is at 0 V and a threshold voltage is about 2 V. For this reason, the channel of the select cell in which programming is performed from the bitline is not applied with potential (0 V). Therefore, after programming in a memory cell closer to a contact of the bitline, then a memory cell closer to a cell source than the memory cell closer to the contact of the bitline is not allowed for data to be programmed, and random page programming is not allowed.

On the other hand, in the embodiment, gate potentials of the selected word line WL2 and the word lines WL1, WL3 adjacent thereto are only lowered down to the power supply voltage $V_{cc}$ (3.3 V) from potential $V_{pre}+V_{thcell}$ (8 V) when a programming voltage $V_{pgm}$ is supplied to the selected word line WL2. Therefore, the cell transistor Tr1 connected to the word line WL1 which is located on the bitline side of the selected word line WL2 becomes conductive when potential of the bitline is 0 V. Thus even when random page programming is performed, the channel of a select cell in a NAND cell, in which programming is performed, can be supplied with the ground potential Vss (0 V) from a bitline.

When programming is performed in a word line WL0, potential of the adjacent word line WL1 is decreased from potential $V_{pre}+V_{thcell}$ (8 V) to the power supply voltage $V_{cc}$ (3.3 V). At this point, a select gate line SSL may be decreased from potential $V_{pre}+V_{thcell}$ (8 V) to the power supply voltage $V_{cc}$ (3.3 V). It is described to reduce the select gate line SSL to the power supply voltage $V_{cc}$ in the third potential.

As described above, after a programming voltage $V_{pgm}$ is applied to the selected word line WL2, as in the first embodiment, transistors Q2, Q3, Q5 connected between a bitline and a sense amplifier are made conductive and a voltage of the bitline is controlled based on data latched in the sense amplifier. Operations thereafter are similar to those in the first embodiment and thereby descriptions thereon are omitted.

According to the second embodiment, when a programming voltage $V_{pgm}$ is supplied to the selected word line WL2, potentials of the gates of a selected word line and a word line adjacent thereto are decreased from potential $V_{pre}+V_{thcell}$ (8 V) to the power supply voltage $V_{cc}$ (3.3 V), wherein the potentials are not decreased down to the ground potential. Therefore, when the ground potential $V_{ss}$ (0 V) is supplied to the channel of a select cell from a bitline, since an adjacent cell on the bitline side of the select cell is conductive, the ground potential $V_{ss}$ (0 V) can supply to the channel of the select cell. Therefore, random page programming can be performed.

Third Embodiment

Figure 12:
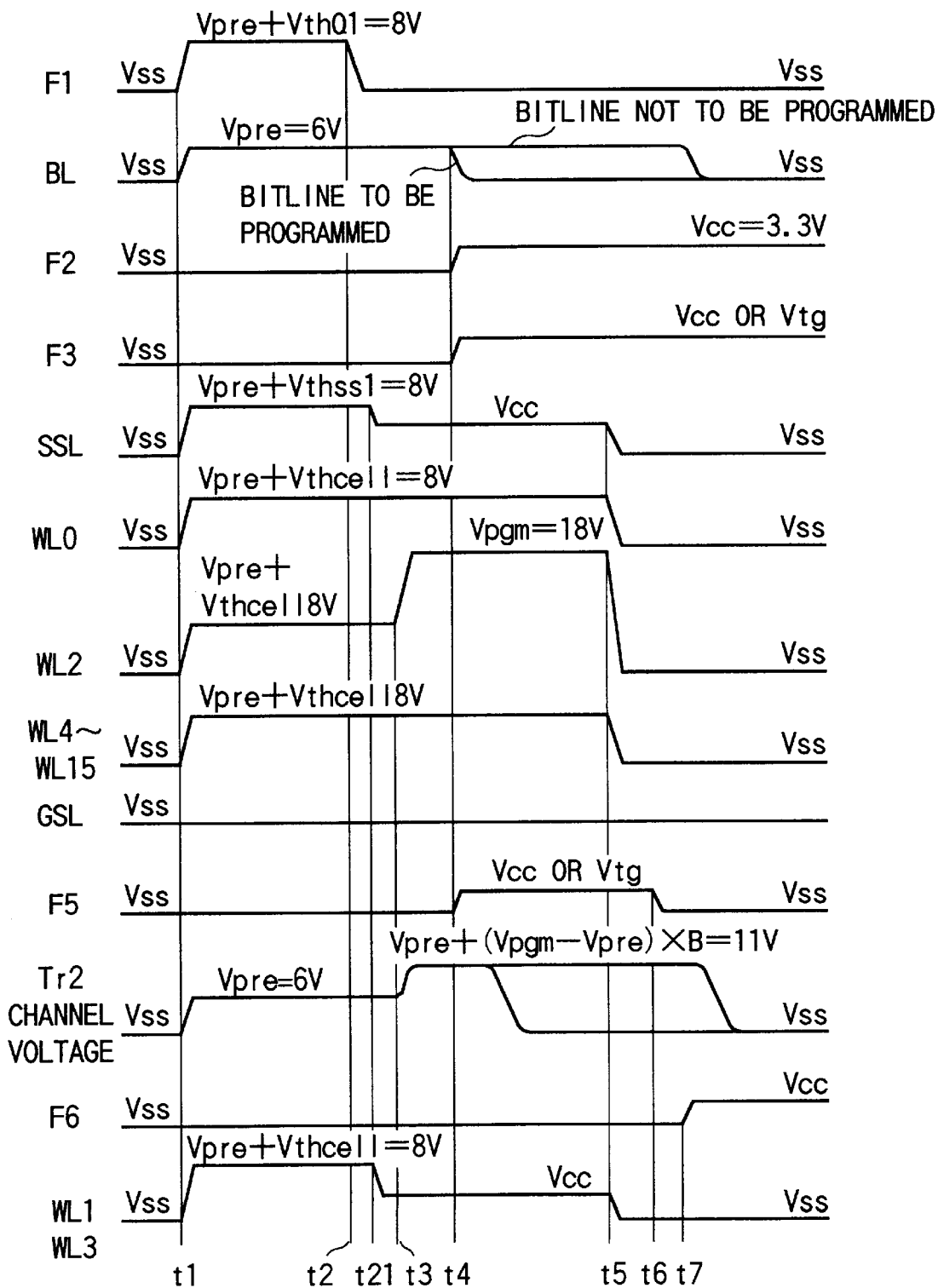
FIG. 12 is a diagram showing waveforms of potentials in programming in a circuit shown in FIG. 9 according to a third embodiment of the present invention.

FIG. 12 is a diagram showing waveforms of potentials in programming in a circuit shown in FIG. 9 according to a third embodiment. In the embodiment, operations from the start till a bitline is precharged to a precharge voltage $V_{pre}$ (6 V) and the channels of the bitline and a NAND cell is brought to be in a floating state with a precharge voltage $V_{pre}$ (6 V) (time t1 to t2) are the same as in the first embodiment and therefore descriptions thereon are omitted.

As mentioned above, the case where programming in, for example, a word line WL2 with the channels of the bitline and the NAND cell in a floating state will be described. Wordlines WL1, WL3 are reduced from potential $V_{pre}+V_{thcell}$ (8 V) to the power supply voltage $V_{cc}$ (3.3 V) (time t21). As a result, since transistors Tr1, Tr3 are cut off, the channel of the cell transistor Tr2 is disconnected from the NAND cell. At the same time as this disconnection, a select gate line is reduced from potential $V_{pre}+V_{thcell}$ (8 V) to the power supply voltage $V_{cc}$ (3.3 V). As a result, the transistor ST1 of the select gate is cut off and the NAND cell is disconnected from the bitline.

After potentials of the word lines WL1, WL3 are reduced from potential $V_{pre}+V_{thcell}$ (8 V) to the power supply voltage $V_{cc}$ (3.3 V), potential of the word line WL2 is increase from potential $V_{pre}+V_{thcell}$ (8 V) up to a programming voltage $V_{pgm}$, for example 18 V (time t3). A timing of increasing potential of the word line WL2 is the same time as that when potentials of the word lines WL1, WL3 are decreased to 3.3 V from 8 V (time t21). As potential of the word line WL2 is increased, potential of the cell transistor Tr2 is increased by capacitive coupling between the channel and the word line WL2. For example, if a capacitive coupling ratio B between the channel of the cell transistor Tr2 and the word line WL2 is 0.5, the channel voltage is 6 V+(18 V–8 V)×0.5 11 V. When the channel of the cell transistor Tr2 is increased to 11 V, since the transistors Tr1, Tr3 adjacent thereto are cut off, an electric charge in the channel of the cell transistor Tr2 never migrate to the adjacent transistors Tr1, Tr3. Therefore, the channel potential of the cell transistor Tr2 is efficiently boosted.

Next, as in the first embodiment, control signals F2, F3, F5 of transfer gates between the bitline and the sense amplifier come to be higher and the transistors Q2, Q3, Q5 becomes conductive (time t4). At this point, potentials of the control signals F2, F3, F5 are set to be the power supply voltage $V_{cc}$, $V_{cc}$ or $V_{ig}$ and $V_{cc}$ or $V_{ig}$. The potential $V_{tg}$ is a voltage at between the ground potential and the power supply voltage, for example 1.8 V is set. When the transistors Q2, Q3, Q5 are conductive, potential of the bitline BL is controlled based on data latched in the sense amplifier 13. That is, when data is programmed, since a node N1 is at the ground potential $V_{ss}$ (0), the bitline BL is discharged to be biased to the ground potential $V_{ss}$. As a result, the channels of all the transistors constituting the NAND cell connected to the bitline BL are brought to the ground potential. Therefore, since a voltage between the channel of the cell transistor Tr2 and the control gate is 18 V, electrons are injected to the floating gate, whereby programming is performed.

On the other hand, when programming is not performed, since potential of the node N1 is at the power supply voltage $V_{cc}$ (3.3 V), the bitline holds a precharge voltage $V_{pre}$ (6 V). At this point, here is considered the worst condition in which a bitline in which programming is not performed is sandwiched between bitlines in which programming are performed with a capacitive coupling ratio C between adjacent bitlines being 0.6. A bitline in which programming is not performed is reduced to potential of $V_{pre}-V_{pre}-V_{ss}) \times C=6$ V–(6 V–0 V)×0.6=2.4 V from the precharge voltage $V_{pre}$ (6 V). However, since a threshold voltage of the select gate transistor ST1 to which a substrate bias effect is added is as high as about 2 V, a cut off condition is held. However, if necessary, potential of the select gate line SSL may be reduced to a value $V_{s1}$ between the power supply voltage $V_{cc}$ and the ground potential $V_{ss}$, for example on the order of 2 V in order to make the cut off of the transistor ST1 surer. As a result, the channel of the NAND cell is not subjected to discharge and maintains its floating state. However, potential of select gate line SSL is lowered to potential $V_{st}$ (for example, about 2 V) between the power supply voltage Vcc and the ground potential Vss, if necessary, and a cut off of the transistor ST1 make surer. With this result, a channel of the NAND cell connected to the bitline is not discharged, and the floating state is maintained. Thereby, even though a programming voltage 18 V is applied to the word line WL2, since the channel of the cell transistor Tr2 keeps a high level of 11 V, the cell transistor Tr2 is not programmed with potential difference of 7 V between the word line WL2 and the channel of the cell transistor Tr2 in the floating state.

Operations thereafter are similar to those at times of t5 to t7 shown in the first embodiment and therefore descriptions thereon are omitted.

According to the third embodiment, after the bitline is charged to the precharge voltage $V_{pre}$, when a charge of the bitline is changed based on programming data, potential of the select gate line is reduced equal to or lower than the electric source $V_{cc}$ and thereby the select gate transistor is brought to be in a cut off state. Therefore, since the NAND cell can be disconnected from the bitline, for example, even when a first bitline adjacent to a second bitline which holds a high level holds a low level and potential of the second bitline is reduced because of a coupling noise between bitlines, the channel of the NAND cell can be prevented from discharge in a sufficient manner and error in programming in a memory cell in which programming is not performed can be also prevented.

Fourth Embodiment

Figure 13:
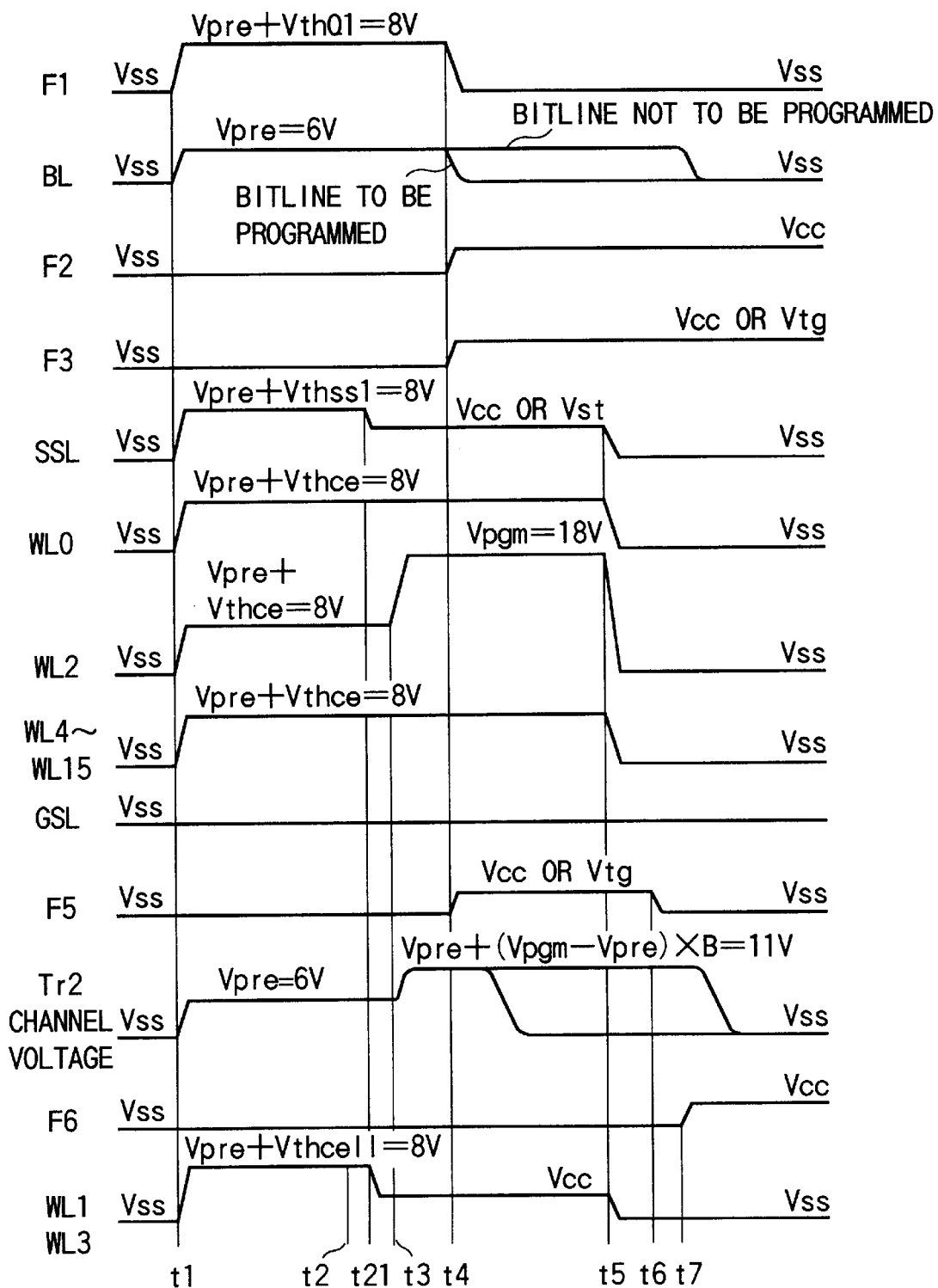
FIG. 13 is a diagram showing waveforms of potentials in programming in a circuit shown in FIG. 9 according to a fourth embodiment of the present invention.

FIG. 13 is a diagram showing waveforms of potentials in programming in a circuit shown in FIG. 9 according to a fourth embodiment. In the embodiment, since operations from the start till a bitline is precharged to a precharge voltage $V_{pre}$ (6 V) and the channels of the bitline and a NAND cell is applied with the precharge voltage (time t1 to t2) are the same as those in the first to third embodiments, descriptions thereon are omitted. In the first to third embodiments, a bitline precharge signal F1 is biased at a time t2 from potential $V_{pre}+V_{thcell}$ (8 V) to the ground potential $V_{ss}$. However, in the embodiment, the bitline precharge signal F1 is held at the potential $V_{pre}+V_{thcell}$ (8 V) at time t2 and thereafter as well, so that the bitline is continued to be charged.

As described above, the case where programming is performed in, for example, a word line WL2 when the channels of the bitline and NAND cell is in a charged state will be described. Wordlines WL1, WL3 are, as described in the third embodiment, reduced from potential $V_{pre}+V_{thcell}$ (8 V) to the power supply voltage $V_{cc}$ (3.3 V) (time t21). As a result, since cell transistors Tr1, Tr2 are cut off, the channel of a cell transistor Tr2 is separated from the NAND cell. Simultaneously, a select gate line SSL is also reduced from potential $V_{pre}+V_{thcell}$ (8 V) to the power supply voltage $V_{cc}$ (3.3 V). As a result, a transistor ST1 of a select gate is cut off and the NAND cell is disconnected from the bitline.

After potentials of the word lines WL1, WL3 are lowered 8 V to 3.3 V, potential of the word line WL2 is increased from potential $V_{pre}+V_{thcell}$ (8 V) to a programming voltage $V_{pgm}$, for example 18 V (time t3). A timing to increase potential of the word line WL3 may be the same as a timing to decrease from 8 V to 3.3 V (time t21). As potential of the word line WL2 is increased, a voltage of the channel of the cell transistor Tr2 is also increased by capacitive coupling between the channel and the word line WL2. For example, if a capacitive coupling ratio B between the channel of the cell transistor Tr2 and the word line WL2 is 0.5, the channel voltage is 6 V+(18 V−8 V)×0.5=11 V. As the channel of the cell transistor is increased to 11 V, since adjacent cell transistors Tr1, Tr3 are cut off, an electric charge in the channel of the cell transistor Tr2 never migrate to adjacent transistors Tr1, Tr3. Therefore, the channel voltage of the cell transistor Tr2 can be boosted efficiently.

Thereafter, a bitline precharge signal F1 is reduced from potential $V_{pre}+V_{thcell}$ (8 V) to the ground potential $V_{ss}$ and the bitline is brought to be in a floating state (time t4). In company with this, control signals F2, F3, F5 of transistors Q2, Q3, Q5 disposed between the bitline and the sense amplifier become a higher level and the transistors Q2, Q3, Q5 are all conductive.

Since operations after programming to a memory cell relating to a selected word line WL2 are similar to those between times t5, t7 shown in the third embodiment, descriptions thereon are omitted.

According to the above mentioned embodiment, the precharge voltage is supplied to the bitline till data are transferred from the sense amplifier to the NAND cell. Therefore, leakage of the potential of the bitline can be prevented and programming data can be transferred with certainty.

Fifth Embodiment

Figure 14:
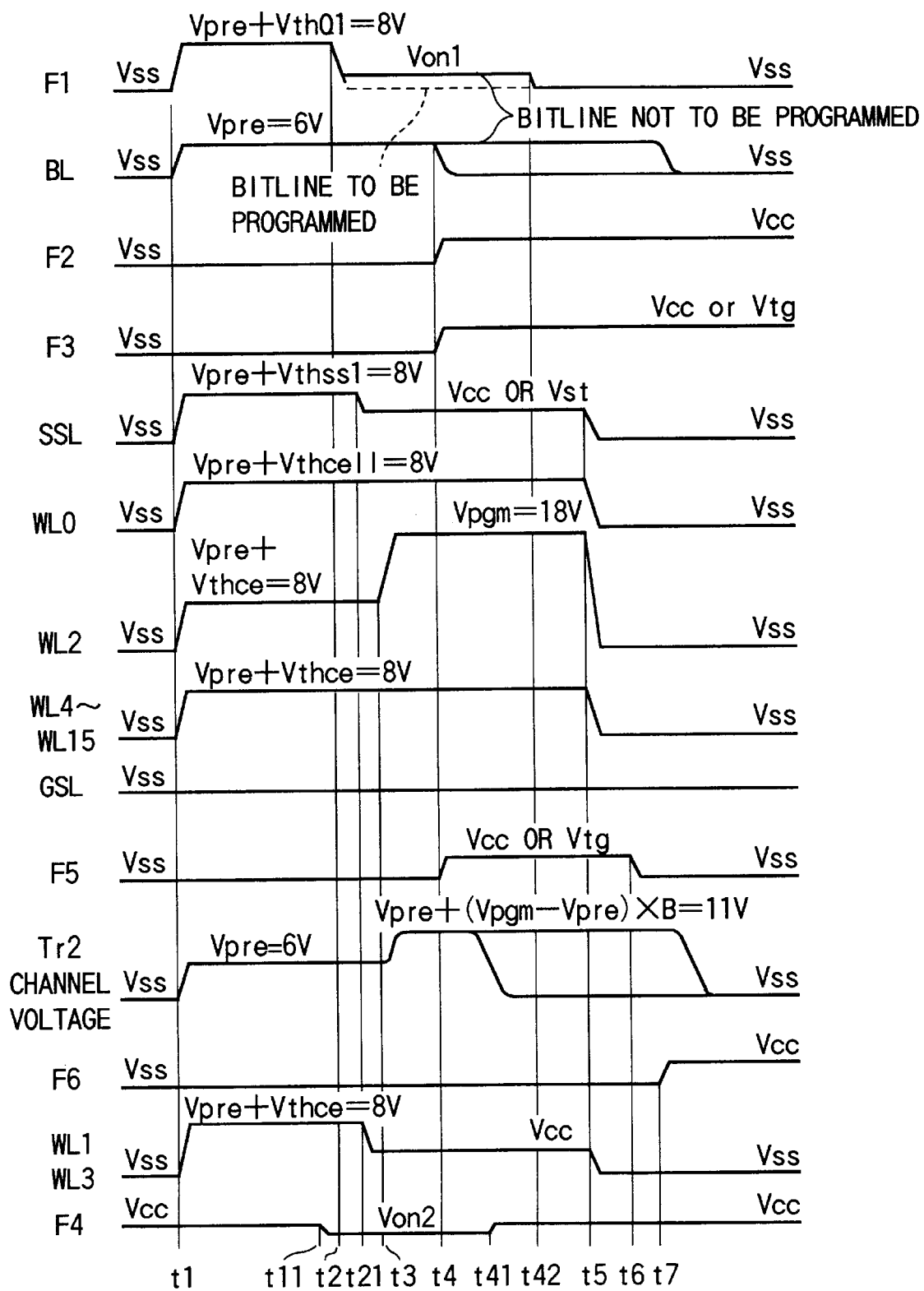
FIG. 14 is a diagram showing waveforms of potentials in programming in a circuit shown in FIG. 9 according to a fifth embodiment of the present invention.

FIG. 14 is a diagram showing waveforms of potentials in programming in a circuit shown in FIG. 9 according to a fifth embodiment. In FIG. 14, operations from a precharge in a bitline to be programmed to which programming data are supplied and a NAND cell connected to the bitline till completion of programming (time t1 to t7) are similar to those in the third embodiment.

On the other hand, operations in which a bitline not to be programmed to which non-programming (prohibited from programming) data are supplied is brought to be in a floating state after a bitline BL is precharged to a precharge voltage $V_{pre}$ (6 V) and voltages of the channels of all the transistors constituting a select NAND cell are biased at the precharge voltage (6 V) (time t1 to t2) are the same as those in the third embodiment. However, control of transistors Q1, Q4 in operations thereafter is different.

That is, in order that potential of the bitline not to be programmed is prevented from decreasing while the side of the bitline to be programmed is working in a programming operation, a transistor Q1 or Q4 is made conductive (time t2 to t4 or t11 to t41). At this point, it is a precondition that a charge current of the transistor Q1 or the transistor Q4 to the bitline is smaller than a current flowing to a transistor Q12 of the sense amplifier for the bitline in which programming is performed. Therefore, if the transistor Q1 is a load transistor, a gate potential thereof is set at $V_{on1}$ (potential of a little higher than the ground potential), for example, the transistor Q1 is operated in a sub-threshold region. In the case of use of the transistor Q4, in similar to the case of use of the transistor Q1, a gate potential thereof is set at $V_{on2}$ (potential of a little lower than the power supply potential), for example, the transistor Q4 is operated in a sub-threshold region.

With such a construction, a reduction in potential of a bitline in which programming is not performed can be alleviated. As a result, the channel of a NAND cell connected to by this bitline not to be programmed is held in a floating state with no discharge therefrom, that is the channel can be held at a high level. Thereby, even when a programming voltage 18 V is applied to a word line WL2, since the channel of the cell transistor Tr2 is held at the high level of 11 V, a voltage between the word line WL2 and the cell transistor Tr2 in the floating state is 7 V and electron injection to the cell transistor Tr2 does not occurs.

Since operations after completion of programming to a memory cell relating to the selected word line WL2 are the same as those in times between t5 and t7 in the third embodiment, descriptions thereon are omitted.

According to the above mentioned embodiment, since potential is supplied to bitlines in which programming is not performed, while a bitline in which programming is performed is in a programming operation, reduction in potential of the bitline not to be programmed can be alleviated.

Sixth Embodiment

Figure 15:
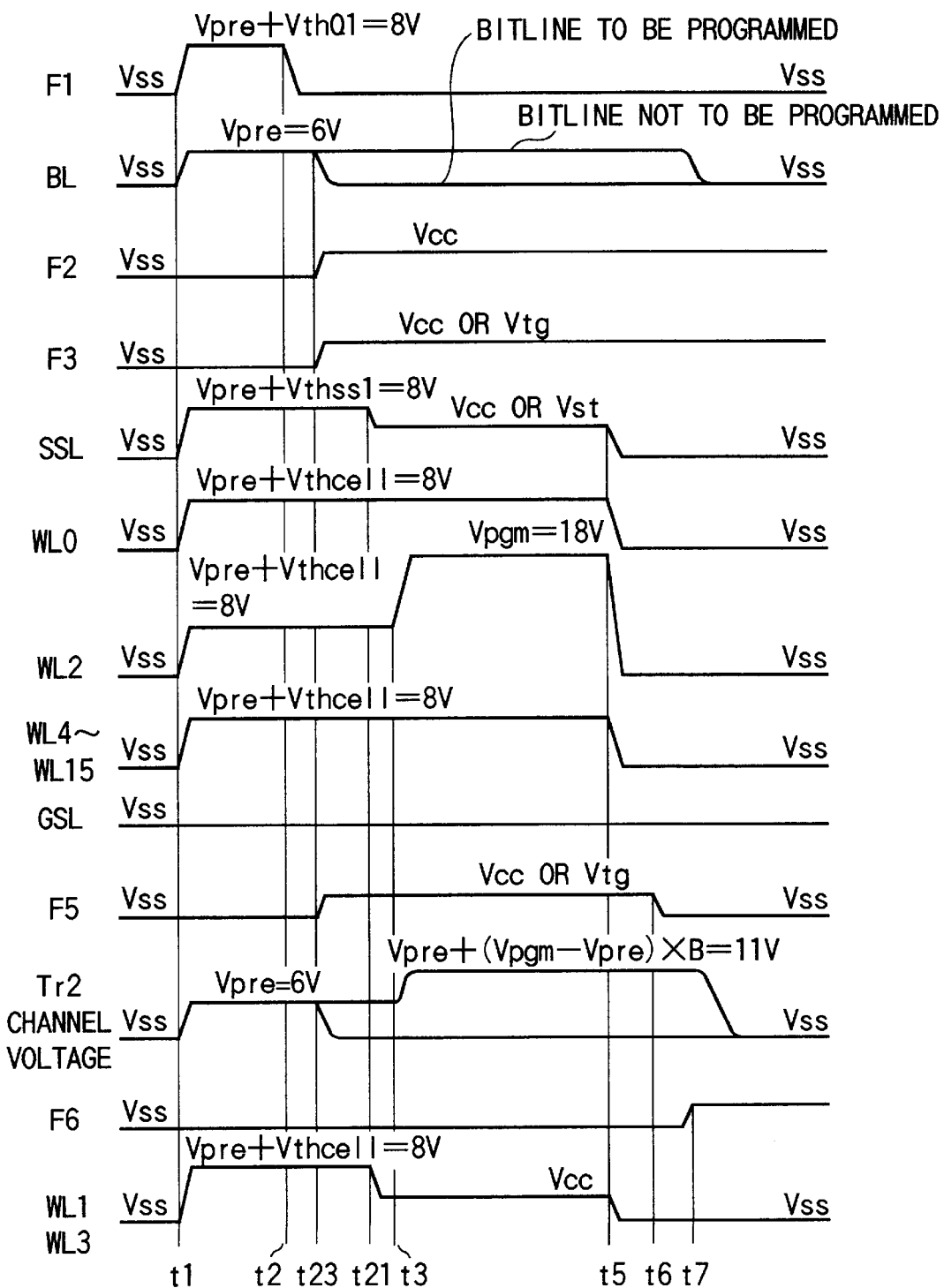
FIG. 15 is a diagram showing waveforms of potentials in programming in a circuit shown in FIG. 9 according to a sixth embodiment of the present invention.

FIG. 15 is a diagram showing waveforms of potentials in programming in a circuit shown in FIG. 9 according to a sixth embodiment. Operations in the embodiment are almost the same as those in the third embodiment, but timings in operation of the transistors Q2, Q3, Q5 are different from those in the third embodiment. That is, in this embodiment, the transistors Q2, Q3 Q5 are already conductive before a programming voltage is applied to a word line of a select cell.

Not only is a bitline BL precharged to a $V_{pre}$ (6 V), but potential of each of all the channels of a select NAND cell is biased at $V_{pre}$ (6 V). When the bitline and the NAND cell are precharged, a bitline precharge signal F1 is decreased from potential $V_{pre}+V_{thQ1}$ (8 V) to the ground potential $V_{ss}$ (0 V) and the channels of the bitline and the NAND cell are brought to be in a floating state (time t2).

Then control signals F2, F3, F5 of the transistors Q2, Q3, Q5 disposed between the bitline and the sense amplifier each become to be a high level and the transistors Q2, Q3, Q5 are conductive (time t23). At this point, high levels of the F2, F3, F5 are set at $V_{cc}$, $V_{cc}$ or $V_{tg}$ and $V_{cc}$ or $V_{tg}$, respectively. The $V_{tg}$ is potential at between the ground potential and an electric source, for example 1.8 V is set.

A potential of the bitline is controlled based on data stored in a sense amplifier 13. That is, when programming is performed, since a node N1 is set at the ground potential $V_{ss}$ (0 V), the bitline is subjected to discharge and potential thereof is biased to the ground $V_{ss}$ potential. As a result, the channel of the NAND cell connected to the bitline is also biased to the ground potential. On the other hand, when programming is not performed, since the node N1 is biased at the power supply voltage $V_{cc}$ (3.3 V), the bitline hods the precharged voltage $V_{pre}$ (6 V).

When programming is performed in, for example, a word line WL2, potentials of word lines WL1, WL3 each are reduced from potential $V_{pre}+V_{thcell}$ (8 V) to the power supply voltage $V_{cc}$ (3.3 V). As a result, the channel of a cell transistor Tr2 in which programming is not performed is disconnected from a NAND cell while cell transistors Tr1, Tr3 are cut off. A potential of a select gate line SSL which is simultaneously selected, is also reduced from potential $V_{pre}+V_{thcell}$ (8 V) to the power supply voltage $V_{cc}$ (3.3 V) (time t21). As a result, a transistor ST1 is cut off and a NAND cell in which programming is not performed is disconnected from a bit line.

After potentials of the word lines WL1, WL3 are decreased to 3.3 V from 8 V, potential of the word line WL2 is increased from potential $V_{pre}+V_{thcell}$ (8 V) to a programming voltage $V_{pgm}$ (18 V) (time t3). In company with this, a channel voltage of a cell transistor Tr2 in which programming is not performed is increased, for example, to 11 V by a capacitive coupling between the channel and the word line WL2. When the channel of the cell transistor Tr2 is increased to 11 V, since the adjacent transistors Tr1, Tr3 are cut off, an electric charge in the channel of the cell transistor Tr2 does not migrate to the adjacent transistors and thus the voltage can be efficiently boosted.

On the other hand, the cell transistor Tr2 in which programming is performed, since potential difference between the channel and the control gate is set at 18 V, electrons are injected into the floating gate and thus programming is performed.

Since operations after completion of programming to a memory cell relating to the word line WL2 (time t5 to t7) are similar to those in the third embodiment, descriptions thereon are omitted.

Seventh Embodiment

Figure 16:
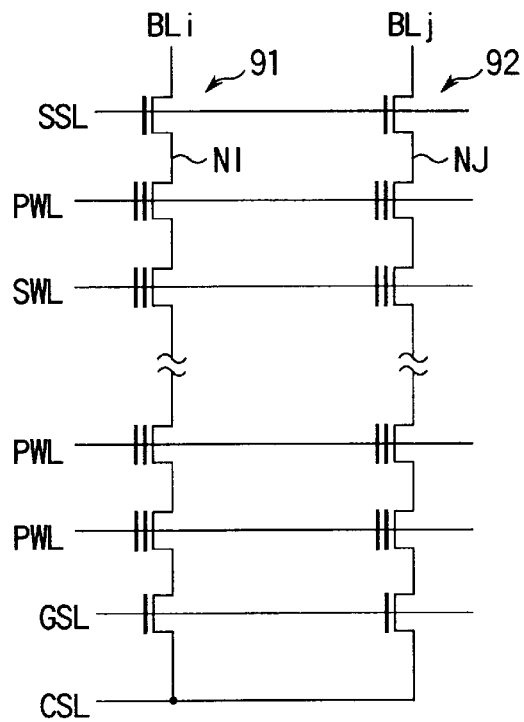
FIG. 16 is a circuit diagram showing a main part of the present invention.

FIG. 16 shows two NAND cells. A NAND cell 91 is connected to a bitline BLi and a NAND cell 92 is connected to a bitline BLj. Select gate lines SSL, GSL indicate select gate lines on the bitline side and source line side respectively, SWL indicates a selected word line, PWL indicates a password line and CSL indicates a cell source line. NI, NJ indicate channel nodes thereof respectively. Here, description is made in which a bitline BLi is a bitline not to be programmed and a bitline BLj is a bitline to be programmed.

Figure 17:
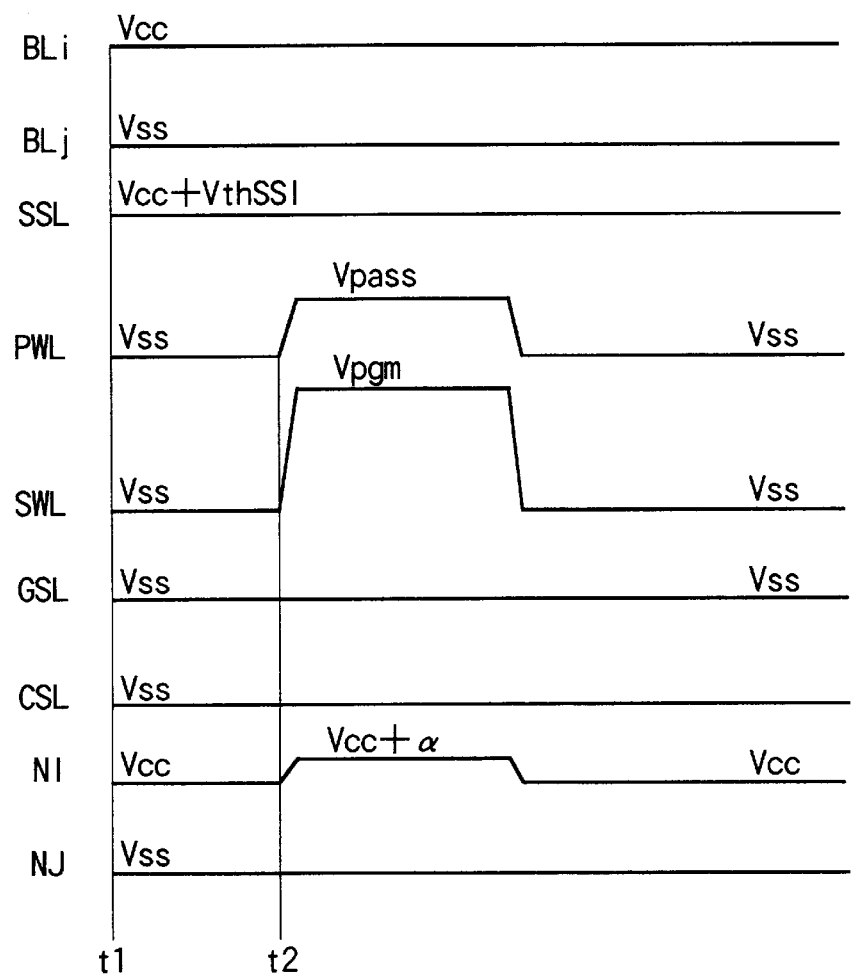
FIG. 17 is a diagram showing waveforms of potentials in programming in a circuit shown in FIG. 16 according to a seventh embodiment of the present invention.

FIG. 17 shows operations in programming according to the seventh embodiment regarding the circuit shown in FIG. 16. Operations in programming of the circuit shown in FIG. 16 will be described in reference to FIG. 17.

In the embodiment, a precharge voltage before a NAND cell is brought to be in a floating state is set higher and a programming prohibiting potential after capacitive coupling with a word line is also set higher. Thereby a margin for errors in programming is made larger.

That is, a power supply voltage $V_{cc}$ is first supplied to the bitline not to be programmed BLi and potential $V_{cc}+V_{thssl}$ ($V_{thssl}$: a threshold voltage of a select gate) is supplied to the select gate line SSL on the bitline side. For this reason, the channel node NI of the NAND 91 in which programming is not performed is charged to the power supply voltage $V_{cc}$ and the channel node NJ of the NAND in which programming is performed is biased to the ground potential $V_{ss}$ (time t1).

Then a programming operation is started and potentials of the word lines PWL, SWL are gradually increased (time t2). At this point, when all the cells of the NAND cells are erased and a threshold voltage of each of the cells is biased equal to or lower than the power supply voltage $V_{cc}$, all the channels of the NAND cells 91 are biased at the power supply voltage $V_{cc}$. Therefore, since a select gate is cut off, the channel is immediately brought to be in a floating state and a voltage thereof is boosted by capacitive coupling with the word line.

When a cell having a high threshold voltage or a cell in which programming is already completed is included in the NAND cell 91 and the word line is biased to $V_{cc}+V_{thcell}$ ($V_{thcell}$: a voltage of a threshold voltage of a cell transistor), the channels of all the cell transistors become conductive and is biased to the power supply voltage $V_{cc}$. Thereafter, the potential of a word line is higher, the channel is immediately brought into a floating state and the voltage thereof is boosted by capacitive coupling with the word line since a select gate is cut off.

Regardless of differences in an erase cell, a cell to be programmed and a threshold voltage, as potential of a word line is increased, all the channels of the NAND cells 91 are charged from the bitline BLi till they reach the power supply voltage $V_{cc}$. When potentials of all the channels of the NAND cells 91 reach the power supply voltage $V_{cc}$ by charging from the bitline BLi, a select gate on the bitline BLi side is cut off to make the channel of the NAND cell brought into a floating state. Thereafter, when the selected word line SWL is biased upward to a programming voltage $V_{pgm}$ and non-selected word line PWL is biased upward to potential $V_{pass}$ of about half the programming voltage, a channel voltage is increased by capacitive coupling with a word line.

In such a way, a programming prohibiting voltage after capacitive coupling with a word line can be set higher if a precharge voltage, before the channel of a NAND cell is brought into a floating state, is set higher. Therefore, potential difference with a programming voltage can be smaller and thereby errors in programming can be prevented.

Eighth Embodiment

Figure 18:
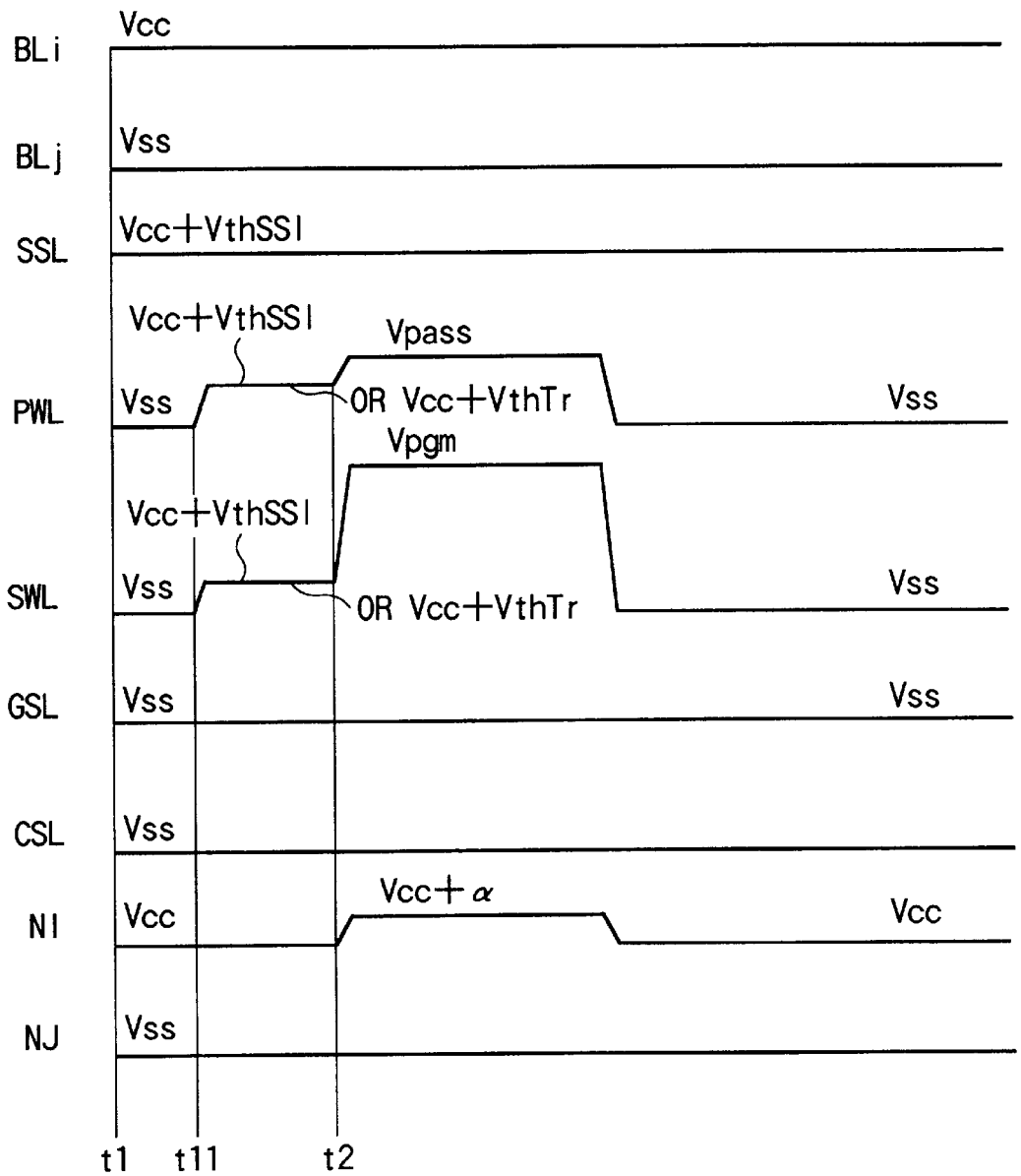
FIG. 18 is a diagram showing waveforms of potentials in programming in a circuit shown in FIG. 16 according to a eighth embodiment of the present invention.

FIG. 18 is a diagram showing operations in programming in a circuit shown in FIG. 16 according to an eighth embodiment. Description operations in programming in the circuit shown in FIG. 16 will be made in reference to FIG. 18. As is similar to the seventh embodiment, a non-programming bitline BLi is biased at the power supply voltage $V_{cc}$ and potential $V_{cc}+V_{thssl}$ is supplied to the select gate line SSL on the bitline BLi side (time t1). Thereafter, potentials of the word lines PWL, SWL are increased to potential of $V_{cc}+V_{thcell}$ (or $V_{cc}+V_{thssl}$) (time t11). Even when one of plural cells constituting the NAND cell is already programmed, all the channels of the NAND cell 91 are perfectly charged to the power supply voltage $V_{cc}$ by increasing potential of a word line to $V_{cc}+V_{thcell}$. Therefore, the threshold voltage $V_{thcell}$ can be set at the maximum threshold of a memory cell after programming.

As in the seventh embodiment, a bitline not to be programmed is set at the power supply voltage Vcc, and potential of Vcc+$V_{thssl}$ is supplied to the select gate SSL on the bitline BLi side (time t1).

Thereafter, potential of the word lines PWL, SWL are increased at Vcc+$V_{thcell}$ (or Vcc+$V_{thssl}$) (time t11). Even if data is programmed to a cell among a plurality of cells constituting the NAND cell 91, all the channels of the NAND cells 91 can be completely charged to the power supply voltage Vcc by increasing the word line potential to Vcc+$V_{thcell}$. Therefore, the threshold voltage $V_{thcell}$ is set at maximum threshold voltage of the memory cell after programming.

After the channel of a cell transistor is sufficiently charged to the power supply voltage $V_{cc}$, if potential of a word line is equal to or higher than the power supply voltage $V_{cc}$, since a select gate is cut off, the channel is brought into a floating state and a channel voltage is increased by capacitive coupling with the word line (time t2). Since the other operations are similar to those of the seventh embodiment, descriptions thereon are omitted.

Even with the embodiment, a margin for errors in programming can be improved in a similar manner to the seventh embodiment.

Ninth Embodiment

Figure 19:
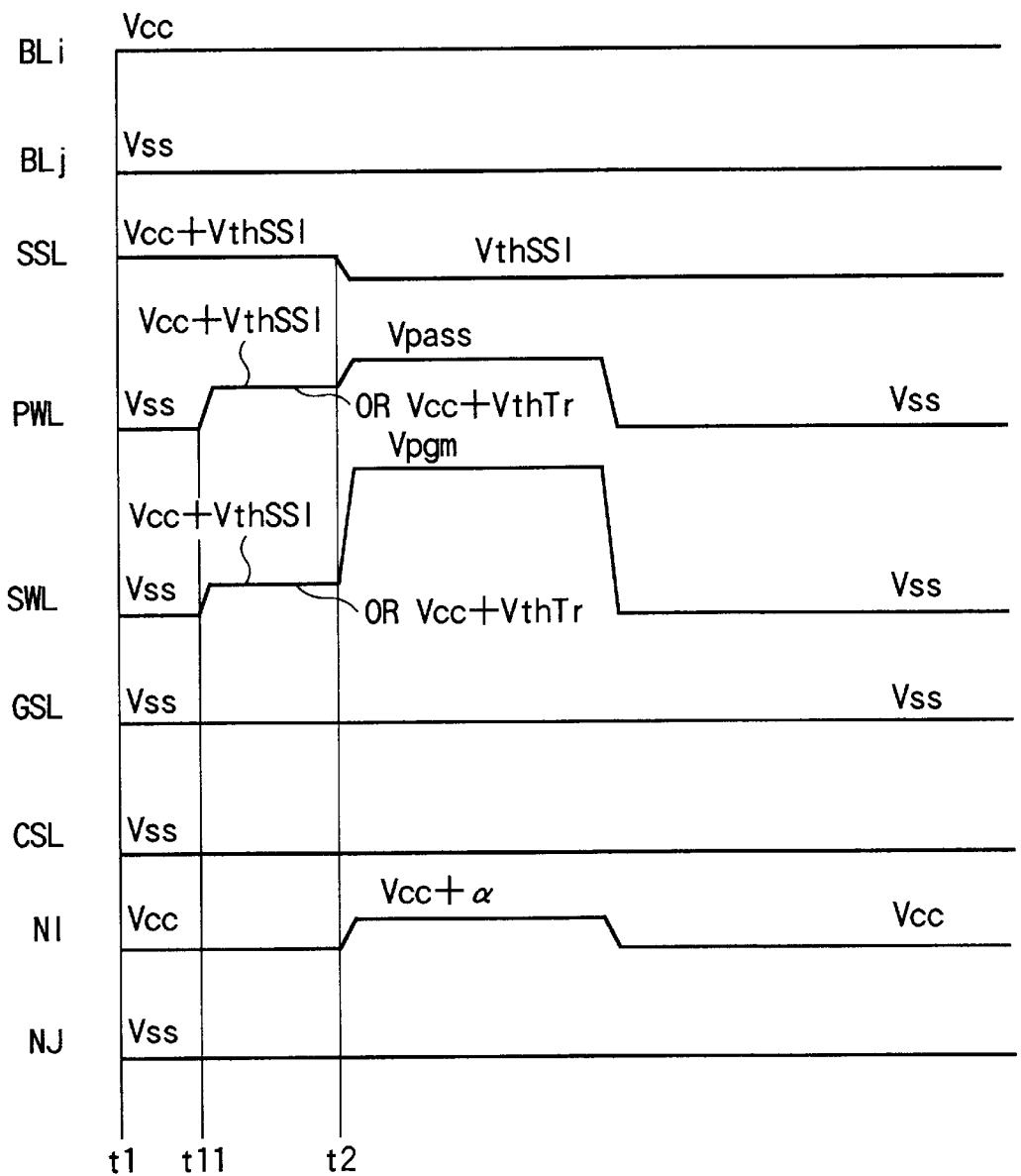
FIG. 19 is a diagram showing waveforms of potentials in programming in a circuit shown in FIG. 16 according to a ninth embodiment of the present invention.

FIG. 19 shows operations in programming in a circuit shown in FIG. 16 according to a ninth embodiment. Operations in programming in the circuit shown in FIG. 16 will be described in reference to FIG. 19.

A non-programming bitline BLi is biased at the ground potential $V_{cc}$ and potential $V_{cc}+V_{thssl}$ is supplied to a select gate line SSL on the bitline side (time t1). A potential of a word line is once increased to $V_{cc}+V_{thssl}$ or $V_{cc}+V_{thcell}$ and the channel of a NAND cell is perfectly charged to the power supply voltage $V_{cc}$ (time t11). Operations hereinbefore are similar to those in the eighth embodiment.

In such a manner, after the channel of a cell transistor is sufficiently charged to the power supply voltage $V_{cc}$, if potential of a word line is increased at a value higher than the power supply voltage Vcc, potential of the select gate SSL is reduced from potential of $V_{cc}+V_{thssl}$ to potential equal to or higher than a threshold voltage $V_{thssl}$ and equal to or lower than the power supply voltage $V_{cc}$ (time t2). A timing to decrease a voltage of a select gate, a timing to increase potential of a selected word line to a programming voltage and a timing to increase potential of a non-selected word line to about a half programming voltage are all almost the same. Since the other operations are similar to those of the seventh and eighth embodiments, descriptions are omitted.

According to the ninth embodiment, after the channel of a cell transistor is sufficiently charged, the select gate line SSL is cut off. Therefore, a leakage current from the channel of a cell transistor to a bitline can conspicuously reduced. For this reason, when a channel voltage is increased, the efficiency can be improved by capacitive coupling.

Conventionally, the power supply voltage (3.3 V) has been applied to a select gate located on the bitline side before a word line is activated, in a semiconductor memory device using a floating programming mode. Thereby, the channel portion of a memory cell has been precharged to potential lower than the power supply voltage by a value corresponding to a threshold voltage (about 2 V), that is 3.3 V−2 V=1.3 V.

On the other hand, according to the seventh to ninth embodiments, since the channel portion of a memory cell is precharged to the power supply voltage, if a coupling ratio between the gate of a memory cell and the channel thereof is 0.5, a margin for errors in programming can be increased by 2 V (a threshold voltage of a select gate)×0.5=1 V.

A magnitude of a junction capacitance is proportional to a reciprocal of a square root of a sum of a built-in potential and a reverse bias voltage of a pn-junction. Therefore, for example, if a built-in potential is 0.7 V and a junction capacitance Cj is at a reverse bias voltage of 1.3 V, a junction capacitance at a reverse bias voltage of 3.3 V is calculated as follows:

SQRT[(0.7+1.3)/(0.7+3.3)]Cj=0.7Cj.

A junction capacitance Cj at a reverse bias voltage of 3.3 V is 70% as small as that at a reverse bias voltage of 1.3 V. While a coupling ratio between a word line and a channel is increased by a amount corresponding to a decrease in a junction capacitance caused by an increase in a voltage of the channel, according to the seventh to ninth embodiments, a coupling ratio is increased by a amount corresponding to a increase in a voltage to which the channel is precharged and thereby a voltage of the channel is efficiently increased with increase in potential of a word line, so that a programming prohibiting potential can be set at a higher value and a margin for errors in programming can be improved.

In the seventh to ninth embodiments, the power supply voltage is supplied to a non-programming bitline BLi and the channel node NI of the NAND cell 91 in which programming is not programmed is charged to the power supply voltage $V_{cc}$. However, this is not limited but a precharge voltage higher than the power supply voltage $V_{cc}$ may be supplied to a non-programming bitline BLi and potential higher than the precharged voltage by at least a threshold voltage of each of transistors may be supplied to word lines PWL, SWL and a select gate line SSL. A potential higher than $V_{cc}+V_{thcell}$ or $V_{cc}+V_{thcell}$, for example potential up to the order of $V_{cc}+2\ V_{thcell}$ or $V_{cc}+2\ V_{thssl}$, can be supplied to the word lines PWL, SWL and the select gate line SSL.

In the embodiments, while a precharge voltage is produced within a chip, but this is not specific but the precharge voltage may be supplied externally (from external device).

In the case where a non-programming bitline BLi is precharged as in the seventh to ninth embodiments, the $V_{cc}$ may be given to the bitline BLi from a sense amplifier with no precharge circuit 14 or the like provided.

While in the above mentioned embodiments, the cases where the present invention is applied to a NAND cell are described, the present invention is not limited to the cases, but can be applied to various memory cell units, such as a AND cell, a DINOR cell and the like.

In addition, it should be needless to say that various modifications of or changes in the above mentioned embodiments can be possible within the scope of the gist of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprising:
   a memory cell array in which memory cell units are arranged in a matrix, each memory cell unit being constructed by connecting plural memory cells, each of which is electrically rewritable;
   a select gate connected to a select gate line for connecting a memory cell unit to a bitline;
   a first precharge circuit connected to a first node of the bitline, for supplying a power supply voltage higher than 0 V;
   a second precharge circuit connected to a second node of the bitline, for supplying a precharge voltage higher than the power supply voltage in programming of data; and
   a latch circuit for holding data transferred to the bitline.

2. A semiconductor memory device according to claim 1, wherein the precharge voltage is generated by a booster circuit provided in the semiconductor memory device.

3. A semiconductor memory device according to claim 1, wherein the precharge voltage is supplied from outside of the semiconductor memory device.

4. A semiconductor memory device according to claim 1, wherein said second precharge circuit comprises an n-channel MOS transistor in which the source is connected to the bitline and the drain is connected to a precharge voltage source.

5. A semiconductor memory device comprising:

a memory cell array in which memory cell units are arranged in a matrix, each memory cell unit being constructed by connecting plural memory cells, each of which is electrically rewritable;

a select gate connected to a select gate line for connecting a memory cell unit to a bitline;

a row selecting circuit for selecting a word line of the memory cell array and the select gate line;

a voltage generating circuit connected to the row selecting circuit and for generating a programming voltage;

a column selecting circuit for selecting the bitline of the memory cell array;

a precharge circuit connected to a first node of the bitline for supplying a precharge voltage higher than a power supply voltage in programming of data; and a latch circuit connected to a second node of the bitline via a transfer gate for holding data to be programmed into a memory cell;

a control circuit for controlling the voltage generating circuit, the precharge circuit and the transfer gate, wherein the control circuit executes in programming data into the memory cell:

a first operation in which a signal is supplied to the precharge circuit, and a voltage of a channel of a memory cell in a selected memory cell unit is charged to the precharge voltage via the bitline;

a second operation in which a voltage of the channel of a memory cell is biased to a programming prohibiting voltage higher than the precharge voltage by supplying the programming voltage to a word line through which programming is performed in a selected memory cell from the voltage generating circuit and by capacitive coupling between the word line and the channel of the memory cell connected thereto; and a third operation, in which the transfer gate is made conductive, and in which potentials of a bitline and the channel voltage of the memory cell unit are controlled based on programming data held in the latch circuit.

6. A semiconductor memory device according to claim 5, wherein the precharge circuit comprises an n-channel MOS transistor in which the source is connected to the bitline and the drain is connected to a precharge voltage source.

7. A semiconductor memory device according to claim 6, wherein the voltage generating circuit supplies a voltage higher than the precharge voltage to the gate of the MOS transistor constituting the precharge circuit, all the word lines of the selected memory cell unit and the select gate line in programming.

8. A semiconductor memory device according to claim 5, wherein the control circuit electrically disconnects the precharge circuit from the bitline in the second operation.

9. A semiconductor memory device according to claim 5, wherein the control circuit reduces potential of a word line in which the programming voltage is supplied to the adjacent word line to a voltage equal to or lower than the power supply voltage in the second operation.

10. A semiconductor memory device according to claim 5, wherein the control circuit reduces potentials of a word line in which the programming voltage is supplied to the adjacent word line and the select gate line connected to the select gate to a voltage equal to or lower than the power supply voltage in the second operation.

11. A semiconductor memory device according to claim 10, wherein the control circuit electrically disconnects the precharge circuit from the bitline in the third operation.

12. A semiconductor memory device according to claim 5, further comprising a load transistor connected between the second node of the bitline and a electric source for suppressing reduction in potential of the bitline, wherein the control circuit executes an operation in which the load transistor is made conductive and reduction in potential of the bitline through which programming is prohibited is suppressed in control of potentials of the bitline and the channel of the memory cell based on programming data held in the latch circuit in the third operation.

13. A semiconductor memory device according to claim 5, wherein the control circuit executes the third operation after executing the second operation.

14. A semiconductor memory device according to claim 5, wherein the control circuit executes the second operation after executing the third operation.

15. A semiconductor memory device comprising:

a memory cell array in which memory cell units are arranged in a matrix, each memory cell unit being constructed by connecting plural memory cells, each of which is electrically rewritable;

a select gate connected to a select gate line for connecting a memory cell unit to a bitline;

a row selecting circuit for selecting a word line of the memory cell array and the select gate line;

a voltage generating circuit connected to the row selecting circuit for generating a first voltage higher than a power supply voltage by at least a threshold voltage of the select gate and a programming voltage;

a column selecting circuit for selecting the bitline of the memory cell array, wherein in programming data into a memory cell, a power supply voltage is supplied to a non-programming bitline, the first voltage is supplied to the select gate line from the voltage generating circuit, channels of the memory cells in the memory cell unit, to which the non-programming bitline is connected, are charged to a precharge voltage higher than a differential voltage between a potential of the non-programming bitline and a threshold voltage of the select gate and brought into a floating state, thereafter the programming voltage produced by the voltage generating circuit is supplied to the word line in a selected memory cell unit, the channels of the memory cells in the floating state are biased to a programming prohibiting potential higher than the precharge voltage by capacitive coupling with the word line.

16. A semiconductor memory device according to claim 15, wherein the potential supplied to the non-programming bit line is a power supply voltage in a chip or a power supply voltage from outside of the chip.

17. A semiconductor memory device according to claim 15, wherein the voltage generating circuit generates the first voltage higher than a power supply voltage by the threshold voltage of the select gate or the memory cell, and the first voltage is supplied to the select gate line or the word line from the voltage generating circuit in programming of data to the memory cell.

18. A semiconductor memory device according to claim 15, wherein, in programming of data to the memory cell, after the channels of the memory cells are charged to the precharge voltage higher than the differential voltage between the potential of the non-programming bitline and the threshold voltage of the select gate, a voltage supplied to the select gate line is reduced to make the select gate cut off.

19. A semiconductor memory device according to claim 15, wherein, in programming of data to the memory cell, after the channels of the memory cells are charged to the precharge voltage higher than the differential voltage between potential of the non-programming bitline and the threshold voltage of the select gate, a voltage supplied to the select gate line is reduced to a second voltage equal to or lower than the power supply voltage and equal to or higher than a threshold voltage of the select gate from the first voltage and the select gate is cut off.

20. A semiconductor memory device according to claim 19, wherein a timing at which the voltage supplied to the select gate line is reduced to the second voltage from the first voltage; a timing at which the programming voltage is supplied to a selected word line; and a timing at which potential of a non-selected word line of a selected memory cell unit is increased to about half the programming voltage are almost the same.

21. The semiconductor memory device according to claim 1, wherein channels of the plurality of the memory cells constituting a selected memory cell unit are charged to the precharge voltage.

22. The semiconductor memory device according to claim 21, wherein at least one of two memory cells adjacent to a memory cell to be programmed is cut off before a voltage of a word line of the memory cell to be programmed is raised to the programming voltage.

23. The semiconductor memory device according to claim 22, wherein said select gate is cut off before the voltage of the word line of the memory cell to be programmed is raised to the programming voltage.

24. The semiconductor memory device according to claim 23, wherein said second precharge circuit supplies the precharge voltage until data is transferred from said latch circuit to the memory cell to be programmed.

25. The semiconductor memory device according to claim 23, wherein a bitline not to be programmed is charged while a bitline to be programmed performs a programming operation.

26. The semiconductor memory device according to claim 23, wherein said latch circuit is conductive to said bitline before a programming voltage is supplied to the word line of the memory cell to be programmed.

* * * * *